(12) United States Patent
Ohashi et al.

(10) Patent No.: US 9,069,245 B2
(45) Date of Patent: Jun. 30, 2015

(54) NEAR-INFRARED ABSORPTIVE LAYER-FORMING COMPOSITION AND MULTILAYER FILM

(75) Inventors: Masaki Ohashi, Joetsu (JP); Seiichiro Tachibana, Joetsu (JP); Kazumi Noda, Joetsu (JP); Shozo Shirai, Joetsu (JP); Takeshi Kinsho, Joetsu (JP); Wu-Song Huang, Hopewell Junction, NY (US); Dario L. Goldfarb, Yorktown Heights, NY (US); Wai-Kin Li, Hopewell Junction, NY (US); Martin Glodde, Hopewell Junction, NY (US)

(73) Assignees: SHIN-ETSU CHEMICAL CO., LTD., Tokyo (JP); INTERNATIONAL BUSINESS MACHINES CORPORATION, Armonk, NY (US)

( * ) Notice: Subject to any disclaimer, the term of this patent is extended or adjusted under 35 U.S.C. 154(b) by 121 days.

(21) Appl. No.: 13/091,287

(22) Filed: Apr. 21, 2011

(65) Prior Publication Data

US 2011/0262862 A1 Oct. 27, 2011

(30) Foreign Application Priority Data

Apr. 22, 2010 (JP) .................................. 2010-098464

(51) Int. Cl.
G03F 7/09 (2006.01)
G03F 7/11 (2006.01)
(Continued)

(52) U.S. Cl.
CPC ................ G03F 7/0045 (2013.01); G03F 7/11 (2013.01); G02B 5/208 (2013.01); G02B 5/22 (2013.01); G03F 7/091 (2013.01)

(58) Field of Classification Search
None
See application file for complete search history.

(56) References Cited

U.S. PATENT DOCUMENTS 4,558,949 A 12/1985 Uehara et al.
4,962,318 A 10/1990 Nishi (Continued)

FOREIGN PATENT DOCUMENTS

JP 58-113706 A 7/1983
JP 2-54103 A 2/1990

(Continued)

OTHER PUBLICATIONS

Narayanan et al., "A New Method for the Synthesis of Heptamethine Cyanine Dyes: Synthesis of New Near-Infrared Fluorescent Labels" J. Org. Chem., 60, pp. 2391-2395, (1995).

(Continued)

*Primary Examiner* — Cynthia H Kelly
*Assistant Examiner* — Alyssa L Cepluch
(74) *Attorney, Agent, or Firm* — Birch, Stewart, Kolasch & Birch, LLP

(57) ABSTRACT

A composition comprising (A) a near-infrared absorbing dye of formula (1), (B) a polymer, and (C) a solvent is used to form a near-infrared absorptive layer. In formula (1), $R^1$ and $R^2$ are a monovalent hydrocarbon group which may contain a heteroatom, k is 0 to 5, m is 0 or 1, n is 1 or 2, Z is oxygen, sulfur or $C(R')(R'')$, R' and R'' are hydrogen or a monovalent hydrocarbon group which may contain a heteroatom, and $X^-$ is an anion.

15 Claims, 6 Drawing Sheets

(51) Int. Cl.
*G03F 7/004* (2006.01)
*G02B 5/20* (2006.01)
*G02B 5/22* (2006.01)

(56) References Cited

U.S. PATENT DOCUMENTS

| | | | |
|---|---|---|---|
| 5,412,214 A | | 5/1995 | Suzuki et al. |
| 5,541,235 A | * | 7/1996 | Busman et al. ............ 522/25 |
| 5,554,485 A | | 9/1996 | Dichiara et al. |
| 5,635,333 A | * | 6/1997 | Petersen et al. ............ 430/311 |
| 5,650,483 A | | 7/1997 | Malik et al. |
| 5,948,847 A | * | 9/1999 | Iguchi et al. ............ 524/502 |
| 6,312,867 B1 | | 11/2001 | Kinsho et al. |
| 6,329,125 B2 | | 12/2001 | Takechi et al. |
| 7,510,820 B2 | | 3/2009 | Hatakeyama et al. |
| 7,745,104 B2 | | 6/2010 | Hatakeyama et al. |
| 7,771,913 B2 | | 8/2010 | Kaneko et al. |
| 2006/0128961 A1 | * | 6/2006 | Timpe et al. ............ 546/153 |
| 2006/0234158 A1 | * | 10/2006 | Hatakeyama ............ 430/270.1 |
| 2008/0318160 A1 | | 12/2008 | Ohsawa et al. |
| 2009/0042135 A1 | * | 2/2009 | Patel et al. ............ 430/287.1 |
| 2009/0087799 A1 | | 4/2009 | Tachibana et al. |
| 2009/0208865 A1 | | 8/2009 | Brunner et al. |

FOREIGN PATENT DOCUMENTS

| | | |
|---|---|---|
| JP | 6-29186 A | 2/1994 |
| JP | 6-84789 A | 3/1994 |
| JP | 7-164551 A | 6/1995 |
| JP | 9-73173 A | 3/1997 |
| JP | 2000-336121 A | 12/2000 |
| JP | 2005-15532 A | 1/2005 |
| JP | 2005-250434 A | 9/2005 |
| JP | 2007-145797 A | 6/2007 |
| JP | 2007-171895 A | 7/2007 |
| JP | 2007-297590 A | 11/2007 |
| JP | 2008-65303 A | 3/2008 |
| JP | 2008-83668 A | 4/2008 |
| JP | 2009-98639 A | 5/2009 |
| WO | WO 2007/148621 A1 | 12/2007 |
| WO | WO 2008/038569 A1 | 4/2008 |

OTHER PUBLICATIONS

Rubingh et al., Lithographic Performance of a Dual Stage, 0.93NA ArF Step & Scan System, Proc. of SPIE vol. 5754, p. 681-692, (2005).

Japanese Office Action for corresponding Japanese Application No. 2010-098464 dated Feb. 12, 2014.

* cited by examiner

NEAR-INFRARED ABSORPTIVE LAYER-FORMING COMPOSITION AND MULTILAYER FILM

CROSS-REFERENCE TO RELATED APPLICATION

This non-provisional application claims priority under 35 U.S.C. §119(a) on Patent Application No. 2010-098464 filed in Japan on Apr. 22, 2010, the entire contents of which are hereby incorporated by reference.

PARTIES TO JOINT RESEARCH AGREEMENT

The present invention was made as a result of research activities undertaken within the scope of a joint research agreement between Shin-Etsu Chemical Co., Ltd. of Tokyo, Japan and International Business Machines Corporation of Armonk, N.Y., United States of America.

TECHNICAL FIELD

This invention relates to a composition for forming a near-infrared absorptive layer for use in microfabrication in the semiconductor device manufacture process, and more particularly, to a near-infrared absorptive layer-forming composition adapted for exposure to ArF excimer laser radiation (193 nm). It also relates to a multilayer film formed using the composition.

BACKGROUND ART

Semiconductor devices are manufactured by the microfabrication technology based on photolithography. In the photolithography, a photoresist layer is formed on a silicon wafer. Using an exposure apparatus, an image on an original plate known as a reticle or mask is transferred to the photoresist layer, which is developed into a resist pattern. Then the silicon or a metal or another material underneath the resist pattern is etched for forming an electronic circuit on the silicon wafer. In order to form a pattern of finer size for further integration of semiconductor devices, efforts have been made to reduce the wavelength of the exposure light used in the photolithography. In the mass production process of 64 Mbit DRAM, for example, KrF excimer laser (248 nm) is utilized. For the fabrication of DRAMs requiring a finer patterning size of 0.13 μm or less, ArF excimer laser (193 nm) is utilized. It is under investigation to fabricate 65-nm node devices by combining light of such shorter wavelength with a lens having an increased NA of 0.9. For the fabrication of next generation 45-nm node devices, the $F_2$ lithography of 157 nm wavelength became a candidate. However, for the reasons that the projection lens uses a large amount of expensive $CaF_2$ single crystal, the scanner thus becomes expensive, hard pellicles are adopted due to the extremely low durability of soft pellicles, the optical system must be accordingly altered, and the etch resistance of resist is low; the development of $F_2$ lithography is abandoned, and the ArF immersion lithography is now under study.

In the photolithography wherein a photoresist layer is exposed through a reticle, the moving stage on which a wafer rests is finely moved in the exposure apparatus in a projection light axis direction, so that the wafer surface may be in register with the best image plane of the projection optical system, that is, so as to enhance focus. Used as a sensor for such focusing is an optical focus detection system of the off-axis illumination type in which an imaging light flux (of non-exposure wavelength) is obliquely projected onto the wafer surface and the reflected light is detected, as disclosed in JP-A S58-113706. The imaging light flux used for this purpose is infrared light, especially near-infrared light, as disclosed in JP-A H02-54103, JP-A H06-29186, JP-A H07-146551, and US 20090208865.

The exposure apparatus using infrared light in the focus detection system suffers from the problem that an exact focus cannot be detected because infrared light is transmitted by a photoresist layer. That is, part of infrared light for focus detection is transmitted by the photoresist layer, the transmitted light is reflected by the substrate surface and enters the detection system along with the light reflected by the wafer top surface. As a result, the accuracy of focus detection is degraded.

The optical auto-focusing is such that the position of the top surface of the wafer is determined by reflecting infrared light on the wafer top surface and detecting the reflected light, after which the wafer is driven so as to fall in register with the imaging plane of the projection lens. Apart from the light reflected by the wafer top surface, there is present light that is transmitted by the resist layer and reflected by the substrate surface. If detection light having a certain band of light intensity distribution enters the detection system, the position measurement value represents the center of the light intensity distribution, leading to the degraded accuracy of focus detection. In general, the substrate has a multilayer structure including patterned metal, dielectric material, insulating material, ceramic material and the like, and the patterned substrate makes reflection of infrared light complex so that focus detection may be difficult. If the accuracy of focus detection is degraded, the projected image becomes vague to detract from the contrast, failing to form a satisfactory photoresist pattern.

To increase the accuracy of optical auto-focusing near infrared light, JP-A H07-146551 proposes the use of a photoresist layer containing a near-infrared absorbing dye. In this case, near-infrared light is not transmitted by the photoresist layer, and no reflected light other than the light reflected by the wafer top surface enters the focus detecting system, and as a result, the accuracy of focus detection is improved. However, since the near-infrared absorbing dye used therein should not be one that absorbs exposure light or degrades the resolution of a photoresist, it is least amenable to the photolithography using ArF excimer laser. US 20090208865 proposes a method for introducing a near-infrared absorbing dye-containing layer below a photoresist layer, which method can prevent degradation of the resolution of the resist.

One alternative to the optical autofocus technique is a method based on the principle that detects the pressure of air discharged onto the wafer surface, known as Air Gauge Improved Leveling (AGILE™). See Proc. of SPIE Vol. 5754, p. 681 (2005). Albeit excellent accuracy of position measurement, this method takes a long time for measurement and is not accepted in the mass production of semiconductor devices requiring improved throughputs.

It would be desirable to have a method capable of brief accurate auto-focusing in optical lithography.

CITATION LIST

Patent Document 1: JP-A S58-113706
Patent Document 2: JP-A H02-54103
Patent Document 3: JP-A H06-29186
Patent Document 4: JP-A H07-146551
Patent Document 5: US 20090208865
Non-Patent Document 1: Proc. of SPIE Vol. 5754, p. 681 (2005)

DISCLOSURE OF INVENTION

An object of the invention is to provide a material for forming a near-infrared absorptive layer used in optical autofocusing for enabling high accuracy auto-focusing during an optical lithography process used in semiconductor microfabrication. Another object is to provide a multilayer film comprising a near-infrared absorptive layer of the near-infrared absorptive layer-forming material and a photoresist layer.

The inventors have found that a multilayer film comprising a near-infrared absorptive layer formed from a near-infrared absorptive layer-forming composition comprising a near-infrared absorbing dye of a specific structure and a photoresist layer allows for high accuracy auto-focusing in an optical lithography process.

In one aspect, the invention provides a near-infrared absorptive layer-forming composition comprising (A) at least one near-infrared absorbing dye, (B) at least one polymer, and (C) at least one solvent, wherein the near-infrared absorbing dye has the formula (1):

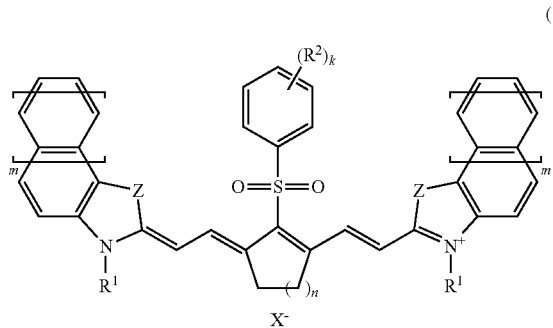

(1)

wherein $R^1$ and $R^2$ are each independently a monovalent $C_1$-$C_{20}$ hydrocarbon group which may contain a heteroatom, k is an integer of 0 to 5, m is 0 or 1, n is 1 or 2, Z is oxygen, sulfur or C(R')(R''), R' and R'' are each independently hydrogen or a monovalent $C_1$-$C_{20}$ hydrocarbon group which may contain a heteroatom, and $X^-$ is an anion of the formula (1-1), (1-2) or (1-3):

(1-1)

(1-2)

(1-3)

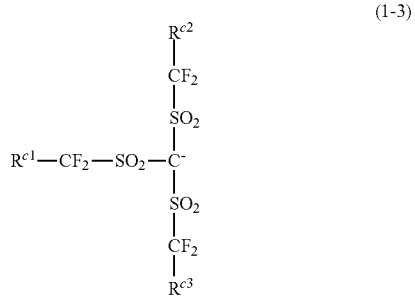

wherein $R^a$, $R^{b1}$, $R^{b2}$, $R^{c1}$, $R^{c2}$ and $R^{c3}$ are each independently fluorine or a monovalent $C_1$-$C_{20}$ hydrocarbon group which may contain a heteroatom, $R^{b1}$ and $R^{b2}$, or $C^{c1}$ and $R^{c2}$ may bond together to form a ring with the linkage to which they are attached, the ring-forming $R^{b1}$—$R^{b2}$ or $C^{c1}$—$R^{c2}$ being a single bond or a divalent hydrocarbon group of 1 to 20 carbon atoms in total which may contain a heteroatom.

In a preferred embodiment, the near-infrared absorbing dye (A) has the formula (2):

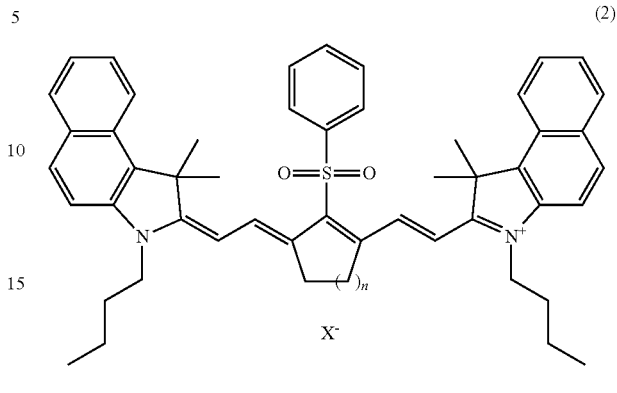

(2)

wherein n is 1 or 2, and $X^-$ is an anion of formula (1-1), (1-2) or (1-3).

In a more preferred embodiment, the near-infrared absorbing dye (A) has the formula (3):

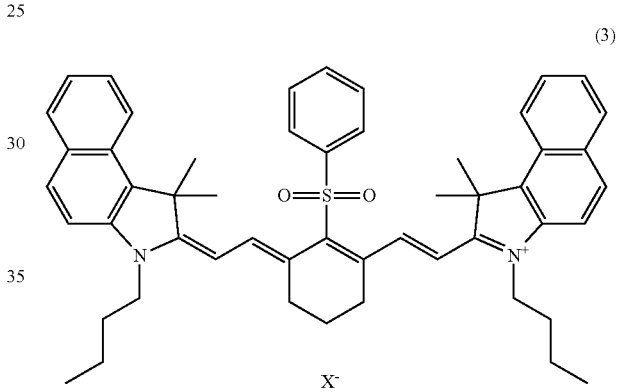

(3)

wherein $X^-$ is an anion of formula (1-1), (1-2) or (1-3).

In a preferred embodiment, the polymer (B) comprises repeat units capable of undergoing crosslinking reaction in the presence of an acid. More preferably, the repeat units capable of undergoing crosslinking reaction in the presence of an acid have an oxirane structure and/or oxetane structure.

The composition may further comprise at least one component selected from an acid generator, a crosslinker, and a surfactant.

In another aspect, the invention provides a multilayer film comprising a near-infrared absorptive layer which is formed by coating the near-infrared absorptive layer-forming composition defined above, and a photoresist layer which is formed of a photoresist composition. Typically, the near-infrared absorptive layer is disposed beneath the photoresist layer.

The multilayer film may further comprise a silicon-containing layer disposed beneath the photoresist layer, the near-infrared absorptive layer being disposed beneath the silicon-containing layer. In a preferred embodiment, the near-infrared absorptive layer functions as an antireflective coating for preventing reflection of exposure radiation used in resist pattern formation.

ADVANTAGEOUS EFFECTS OF INVENTION

By coating a near-infrared absorptive layer-forming composition according to the invention, a near-infrared absorptive layer can be formed. When a multilayer film comprising the near-infrared absorptive layer and a photoresist layer is used in optical lithography, the detection accuracy of the currently employed optical auto-focusing method is improved. This allows the optical lithography to produce a definite projection image with an improved contrast, succeeding in forming a better photoresist pattern.

DESCRIPTION OF EMBODIMENTS

Figure 1:
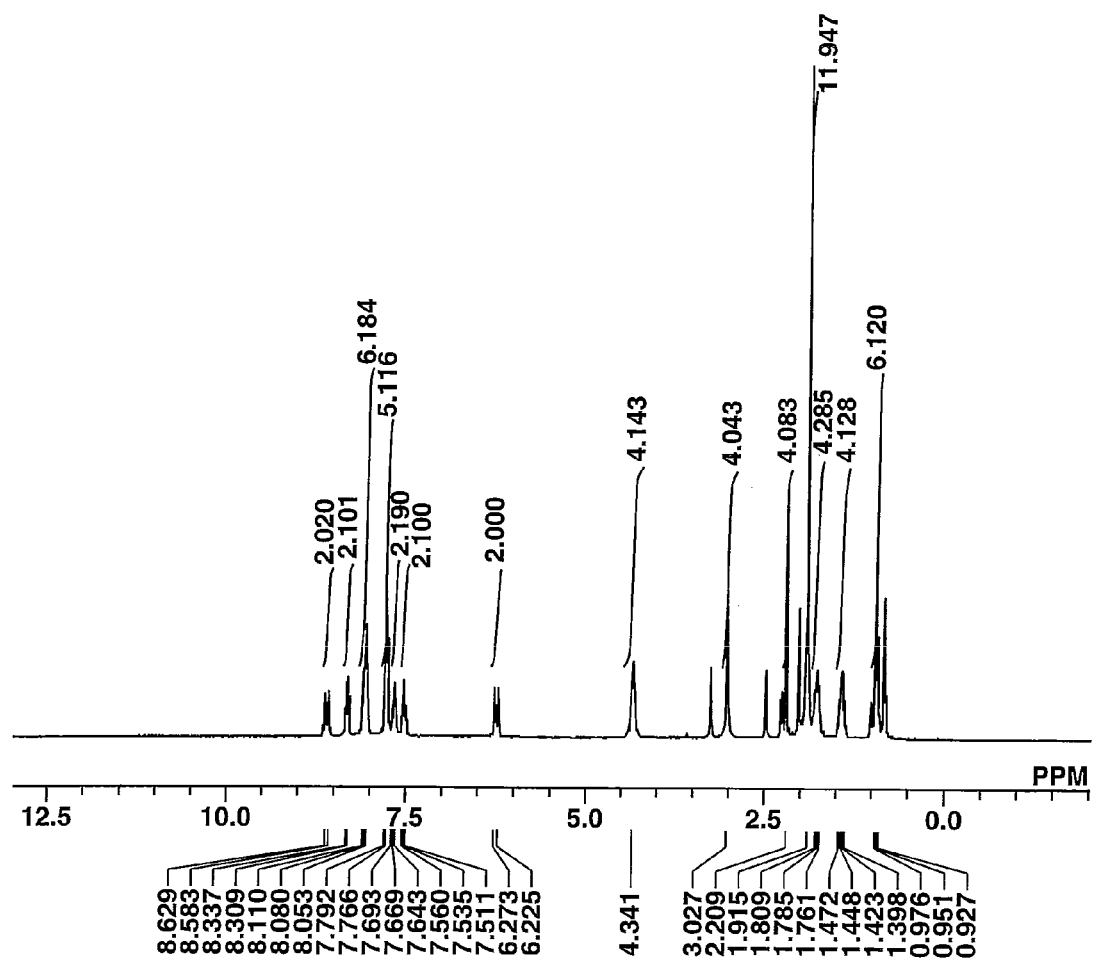
FIGS. 1 and 2 are diagrams of $^1$H-NMR and $^{19}$F-NMR/DMSO-$d_6$ spectra of Dye-A in Synthesis Example 1-1, respectively.

The terms "a" and "an" herein do not denote a limitation of quantity, but rather denote the presence of at least one of the referenced item. As used herein, the notation ($C_n$-$C_m$) means a group containing from n to m carbon atoms per group. As used herein, the term "layer" is used interchangeably with "film" or "coating." Near infrared light is often abbreviated as NIR.

According to the invention, the NIR absorptive layer-forming composition is defined as comprising (A) a NIR absorbing dye, (B) a polymer, and (C) a solvent, which are described below in detail.

A) NIR Absorbing Dye

The NIR absorbing dye used herein as component (A) has the general formula (1).

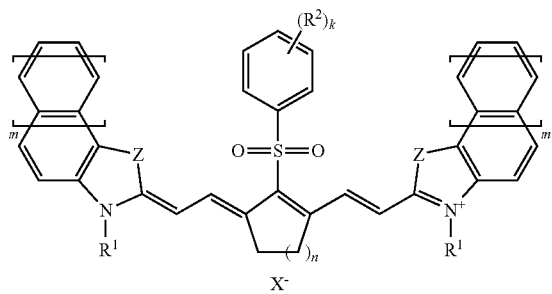

(1)

In formula (1), $R^1$ and $R^2$ are each independently a monovalent $C_1$-$C_{20}$ hydrocarbon group which may contain a heteroatom. The subscript k is an integer of 0 to 5, m is 0 or 1, and n is 1 or 2. Z is a group selected from among oxygen, sulfur, and C(R')(R'') wherein R' and R'' are each independently hydrogen or a monovalent $C_1$-$C_{20}$ hydrocarbon group which may contain a heteroatom. $X^-$ is an anion of the formula (1-1), (1-2) or (1-3):

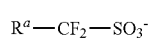

(1-1)

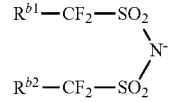

(1-2)

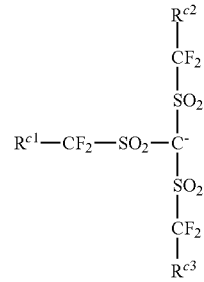

(1-3)

Herein $R^a$, $R^{b1}$, $R^{b2}$, $R^{c1}$, $R^{c2}$ and $R^{c3}$ are each independently fluorine or a monovalent $C_1$-$C_{20}$ hydrocarbon group which may contain a heteroatom. Alternatively, $R^{b1}$ and $R^{b2}$, or $C^{c1}$ and $R^{c2}$ may bond together to form a ring with the linkage to which they are attached, the ring-forming $R^{b1}$—$R^{b2}$ or $C^{c1}$—$R^{c2}$ being a single bond or a divalent hydrocarbon group of 1 to 20 carbon atoms in total which may contain a heteroatom.

In formula (1), $R^1$ is a monovalent $C_1$-$C_{20}$ hydrocarbon group which may contain a heteroatom. Suitable monovalent $C_1$-$C_{20}$ hydrocarbon groups include straight or branched alkyl, alicyclic hydrocarbon, aromatic hydrocarbon, and alkenyl groups. Examples of straight or branched alkyl groups include methyl, ethyl, propyl, isopropyl, n-butyl, sec-butyl, tert-butyl, pentyl, isopentyl, neopentyl, tert-pentyl, 1-methylpentyl, 2-methylpentyl, hexyl, isohexyl, 5-methylhexyl, heptyl, octyl, nonyl, decyl, and dodecyl. Examples of alicyclic hydrocarbon groups include cyclopentyl, cyclohexyl, cycloheptyl, cyclopropylmethyl, 4-methylcyclohexyl, cyclohexylmethyl, norbornyl, and adamantyl. Examples of aromatic hydrocarbon groups include phenyl, o-tolyl, m-tolyl, p-tolyl, xylyl, mesityl, o-cumenyl, m-cumenyl, p-cumenyl, biphenylyl, naphthyl, and anthryl. Examples of alkenyl groups include vinyl, allyl, 1-propenyl, 2-propenyl, isopropenyl, butenyl, hexenyl, and cyclohexenyl.

Suitable heteroatom-containing hydrocarbon groups include the foregoing hydrocarbon groups having substituted thereon an alkoxy group such as methoxy, ethoxy, propoxy or butoxy, the foregoing hydrocarbon groups having carbonyl substituted thereon, the foregoing hydrocarbon groups having hydroxyl substituted thereon, the foregoing hydrocarbon groups having substituted thereon an ester bond such as acetyl or benzoyloxy, the foregoing hydrocarbon groups having carboxyl substituted thereon, the foregoing hydrocarbon groups having sulfonic acid substituted thereon, the foregoing hydrocarbon groups having halogen (e.g., fluorine, chlorine, bromine or iodine) substituted thereon, and the foregoing hydrocarbon groups having substituted thereon a combination of two or more such substituent groups.

Of the foregoing hydrocarbon groups, $C_1$-$C_4$ hydrocarbon groups, typically alkyl and alkenyl are preferred as $R^1$ for ease of synthesis and availability.

In formula (1), $R^2$ is a monovalent $C_1$-$C_{20}$ hydrocarbon group which may contain a heteroatom. Suitable hydrocarbon groups are the same as enumerated for $R^1$. Of the illustrated examples, $C_1$-$C_4$ alkyl and alkoxy groups are preferred as $R^2$ for ease of synthesis and availability. More preferably, $R^2$ is selected from methyl, tert-butyl, methoxy, n-butoxy, tert-butoxy and the like.

In formula (1), Z is a group selected from among oxygen, sulfur, and C(R')(R") wherein R' and R" are each independently hydrogen or a monovalent $C_1$-$C_{20}$ hydrocarbon group which may contain a heteroatom. Suitable hydrocarbon groups are the same as enumerated for $R^1$. Of the illustrated examples, $C_1$-$C_4$ alkyl groups are preferred as R' and R" for ease of synthesis and availability, with methyl, ethyl or the like being more preferred.

$X^-$ is an anion of any one of the formulae (1-1), (1-2) and (1-3). In formula (1-1), $R^a$ is fluorine or a monovalent $C_1$-$C_{20}$ hydrocarbon group which may contain a heteroatom. Suitable hydrocarbon groups which may contain a heteroatom are those of 1 to 20 carbon atoms, preferably 1 to 4 carbon atoms, for example, alkyl groups and substituted alkyl groups. Exemplary alkyl groups include methyl, ethyl, propyl, isopropyl and butyl. Exemplary substituent groups on substituted alkyl groups include hydroxyl, halogen, alkoxy and the like. Exemplary alkoxy groups include methoxy, ethoxy, propoxy and butoxy. Exemplary halogen include chlorine, bromine, fluorine and iodine. For ease of synthesis and availability, fluorine and $C_1$-$C_4$ perfluoroalkyl groups are preferred as $R^a$.

In formula (1-2), $R^{b1}$ and $R^{b2}$ are fluorine or a monovalent $C_1$-$C_{20}$ hydrocarbon group which may contain a heteroatom. Suitable hydrocarbon groups are the same as enumerated for $R^a$. Also $R^{b1}$ and $R^{b2}$ may bond together to form a ring with the linkage (—$CF_2$—$SO_2$—$N^-$—$SO_2$—$CF_2$—) to which they are attached. In this event, the ring-forming $R^{b1}$—$R^{b2}$ is a single bond or a divalent hydrocarbon group of 1 to 20 carbon atoms in total which may contain a heteroatom. Suitable divalent hydrocarbon groups include $C_1$-$C_{20}$ alkylene groups, with methylene, ethylene, propylene, and butylene being preferred. These divalent hydrocarbon groups in which at least one hydrogen is substituted by fluorine are more preferred.

In formula (1-3), $R^{c1}$, $R^{c2}$ and $R^{c3}$ are fluorine or a monovalent $C_1$-$C_{20}$ hydrocarbon group which may contain a heteroatom. Suitable hydrocarbon groups are the same as enumerated for $R^a$. Also $R^{c1}$ and $R^{c2}$ may bond together to form a ring with the linkage (—$CF_2$—$SO_2$—$C^-$—$SO_2$—$CF_2$—) to which they are attached. In this event, the ring-forming $R^{c1}$—$R^{c2}$ is a single bond or a divalent hydrocarbon group of 1 to 20 carbon atoms in total which may contain a heteroatom. Suitable divalent hydrocarbon groups include $C_1$-$C_{20}$ alkylene groups, with methylene, ethylene, propylene, butylene, pentylene, and hexylene being preferred. These divalent hydrocarbon groups in which at least one hydrogen is substituted by fluorine are more preferred.

Preferred examples of the cation moiety in formula (1) are shown below, but are not limited thereto.

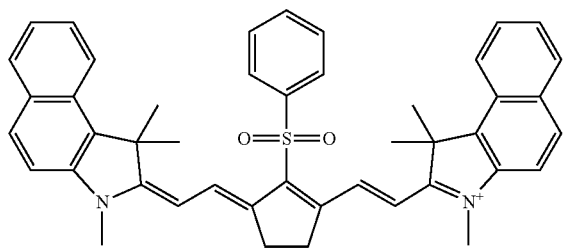

-continued

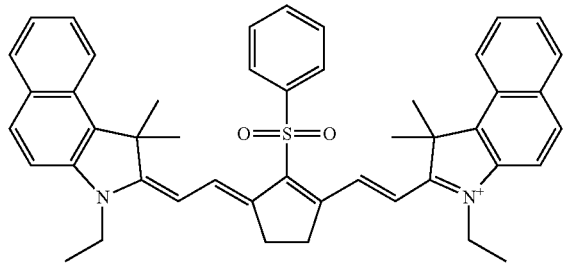

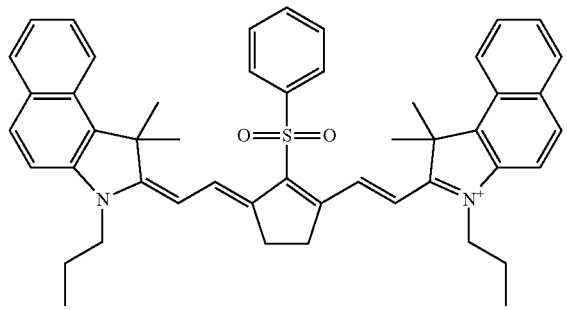

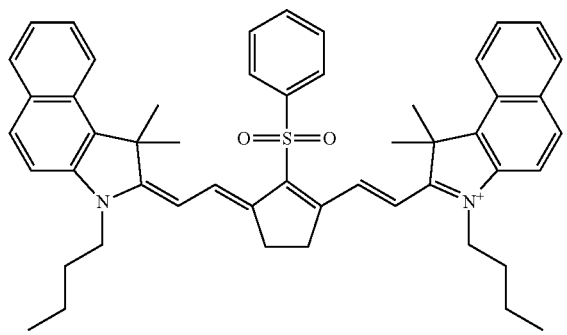

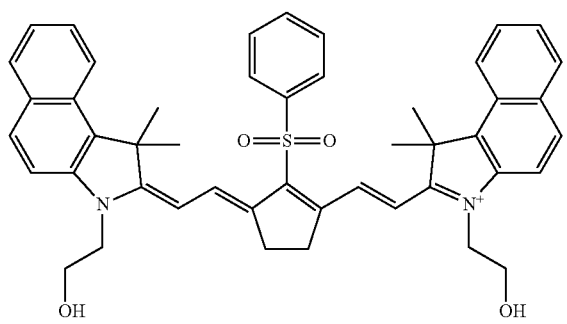

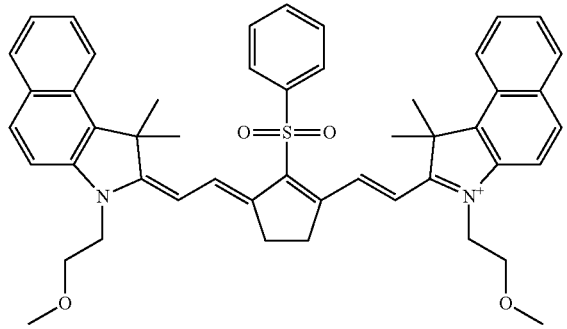

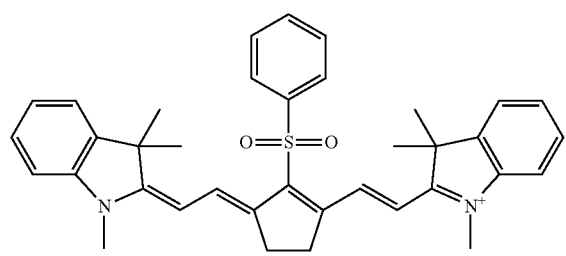
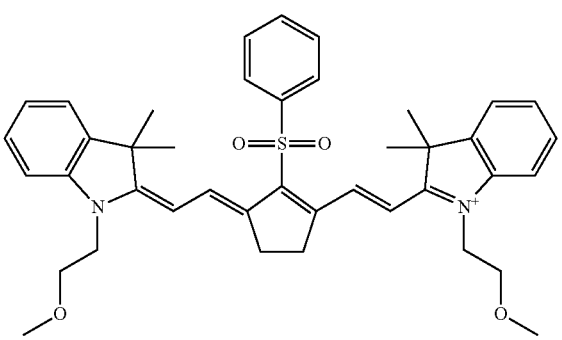
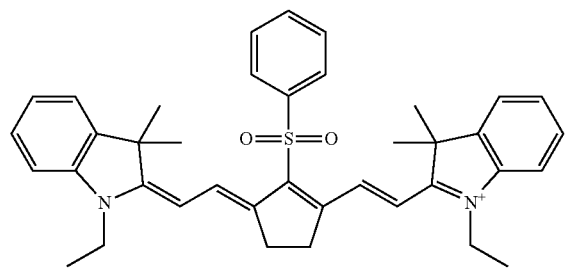
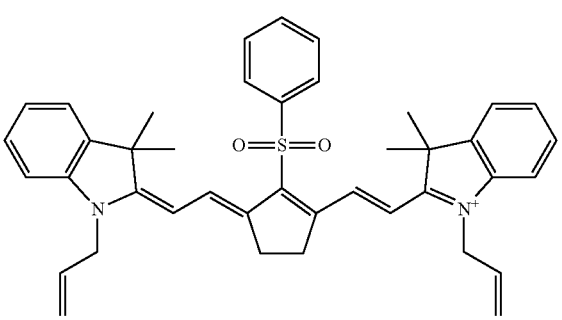
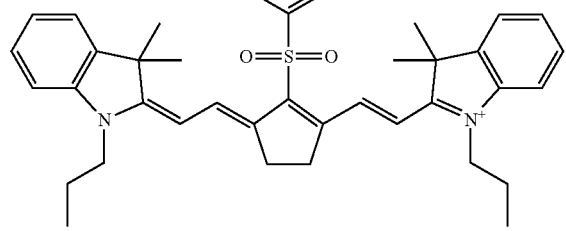
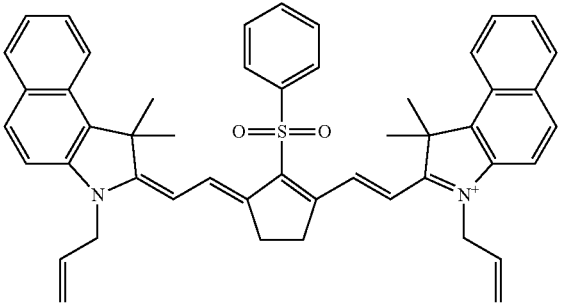
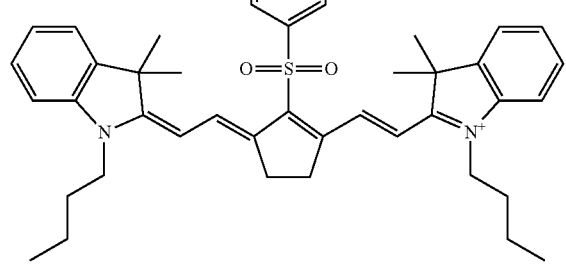
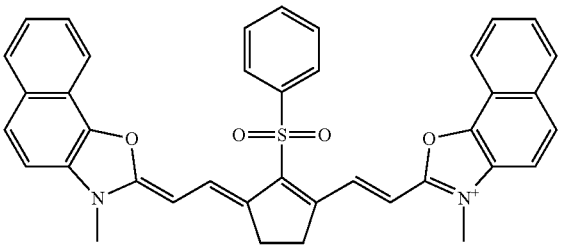
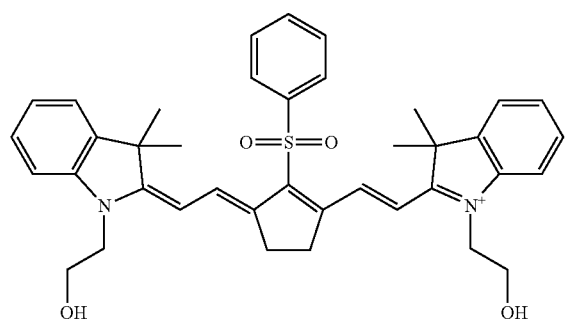
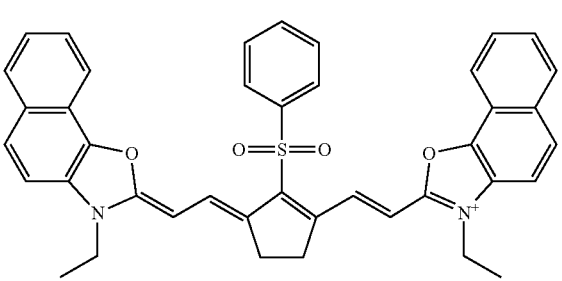

11
-continued

12
-continued

13
-continued
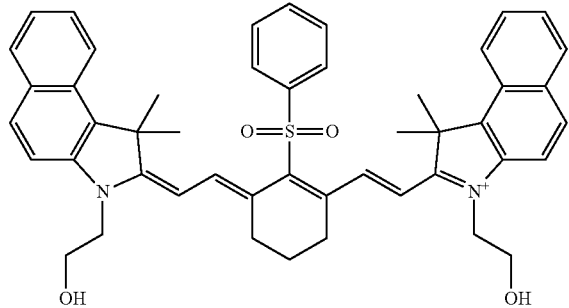
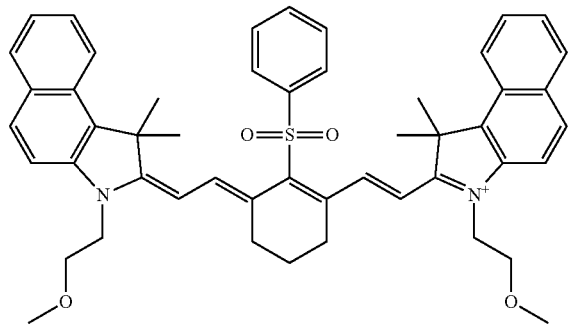
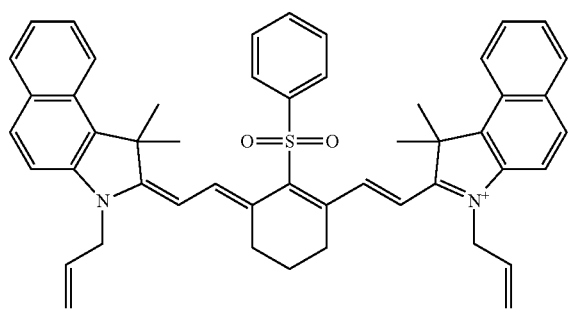
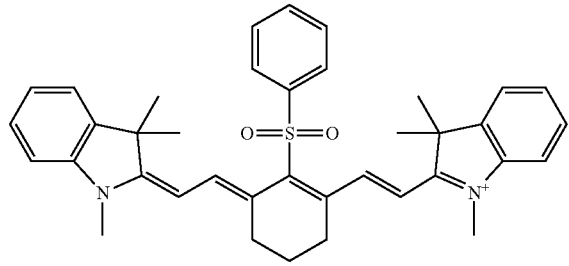
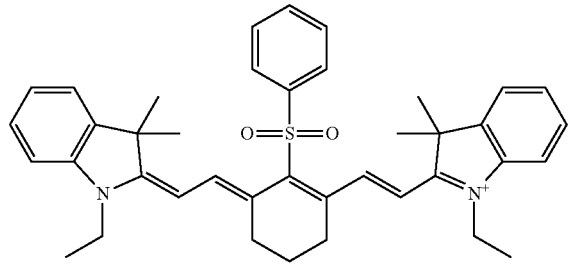
14
-continued
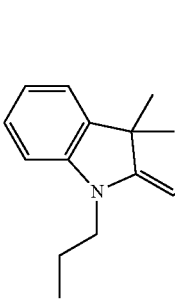
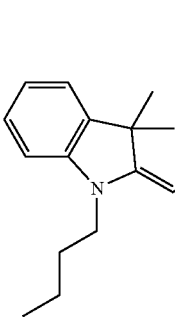
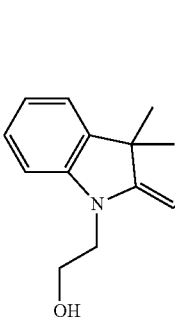
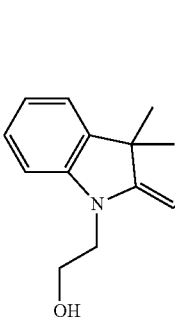
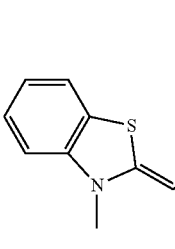

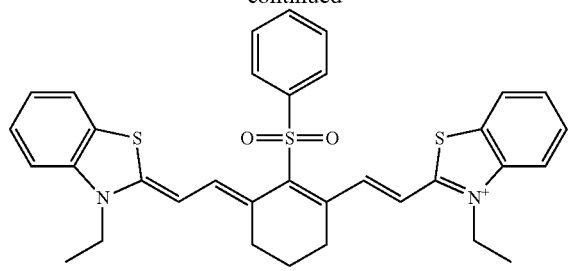
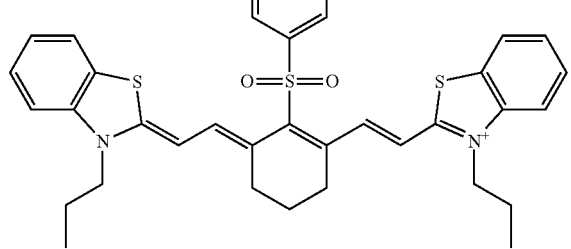
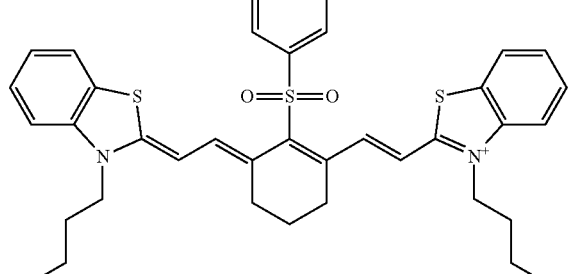
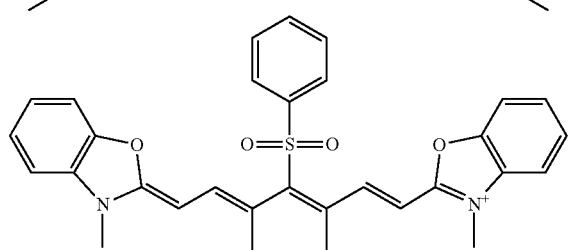
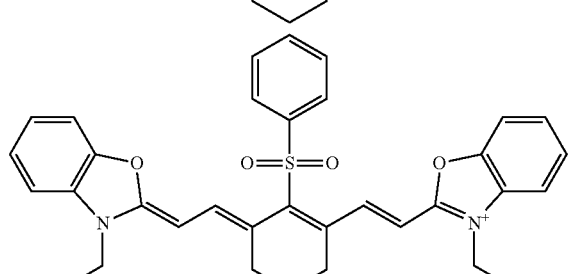
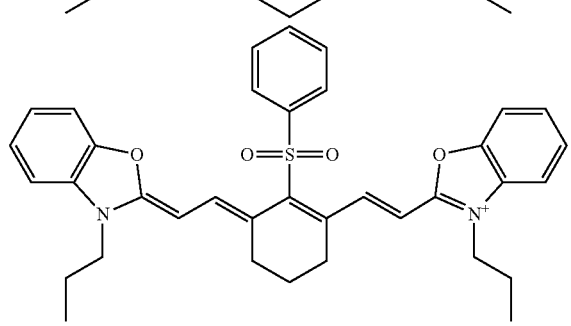
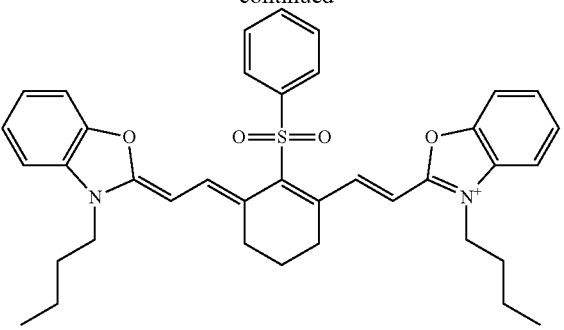
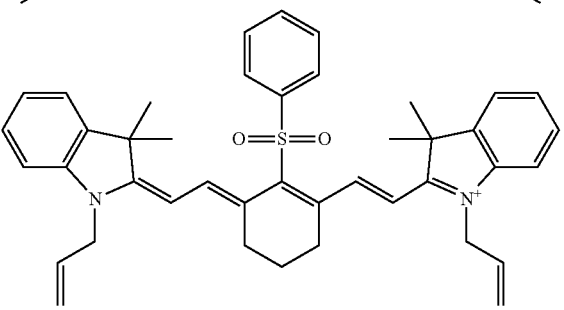

Preferred examples of the anion moiety in formula (1) are shown below, but are not limited thereto.

$CF_3SO_3^-$  $CF_3CF_2SO_3^-$  $CF_3CF_2CF_2SO_3^-$  $CF_3CF_2CF_2CF_2SO_3^-$ $(CF_3SO_2)_2N^-$  $(CF_3CF_2SO_2)_2N^-$  $(CF_3CF_2CF_2SO_2)_2N^-$ $(CF_3CF_2CF_2CF_2SO_2)_2N^-$  $(CF_3SO_2)_3C^-$  $(CF_3CF_2SO_2)_3C^-$ $(CF_3CF_2CF_2SO_2)_3C^-$  $(CF_3CF_2CF_2CF_2SO_2)_3C^-$

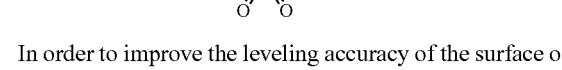

In order to improve the leveling accuracy of the surface of a resist layer using the NIR absorptive layer-forming composition, the NIR absorbing dye in the composition must meet various properties. The required properties include, for example, optical properties, solubility in the layer-forming composition solvent, compatibility with other layer-forming composition components, heat resistance during layer formation, resistance to rinse liquid used in layer rinsing, and the like. With respect to optical properties, the dye should preferably have an absorption region capable of effectively absorbing NIR light emitted from a leveling sensor. If the dye does not match with other layer-forming composition components, typically a solvent and a resin, the composition fails in film formation and is practically unacceptable. An NIR absorptive layer is formed by coating the NIR absorptive layer-forming composition and used as an underlayer film. If the NIR absorbing dye is so unstable that decomposition reaction may occur in the heat curing step, then its NIR absorbing ability is degraded. In the subsequent step of rinsing the film after the film formation, the dye can be washed away together with the rinse liquid, and if so, the performance is degraded as a matter of course. From these considerations, it is essential for improved leveling accuracy that the dye meet the required properties.

The NIR absorbing dye according to the invention meets the required properties. For example, the NIR absorbing dye has an adequate NIR absorption region capable of effectively absorbing a portion of NIR light propagating from a leveling sensor into the film. The configuration of formula (1) having phenylsulfone at the center of the cyanine dye skeleton contributes to a shift of the absorption region toward a longer wavelength side, leading to the absorption region best suited for the intended use of the invention. Also the NIR absorbing dye according to the invention has thermal stability and rinse liquid resistance due to a robust skeleton having indole rings at opposite sides and a ring structure at the center as represented by formula (1). By a choice of alkyl of appropriate length as $R^1$ in formula (1), the dye is improved in compatibility with other film components such as polymer and solvent. The dye is fully useful in these aspects.

In one preferred embodiment, the NIR absorbing dye (A) has a structure of the formula (2):

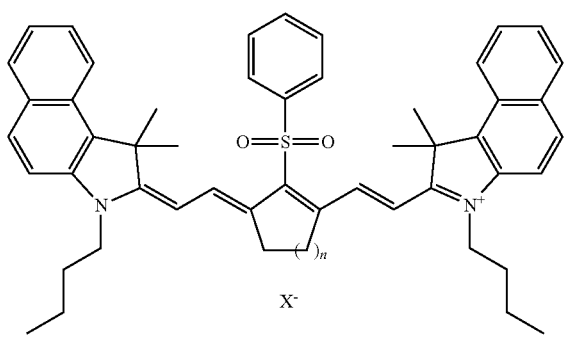

(2)

wherein n is 1 or 2 and $X^-$ is as defined above.

The NIR absorbing dye of formula (2) has benzoindole skeletons and a phenylsulfone skeleton, which contribute to thermal stability and a NIR absorption region suited for the application of the invention. The central cyclic skeleton increases the robustness of the dye, contributing to a further thermal stability improvement. In addition, the alkyl moiety in the benzoindole skeleton increases fat solubility, leading to improvements in solvent solubility and compatibility with a film-forming resin upon film formation.

In a more preferred embodiment, the NIR absorbing dye of formula (2) has a structure of the formula (3):

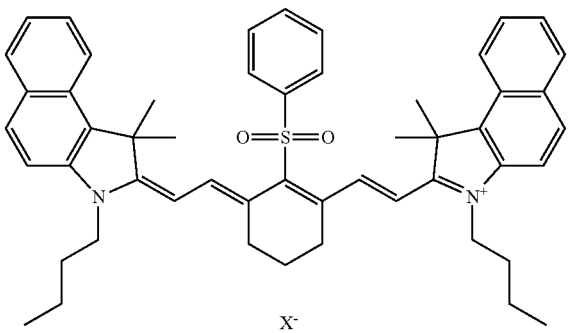

(3)

wherein $X^-$ is as defined above.

The NIR absorbing dye of formula (3) has a 6-membered ring structure at the center and has somewhat higher thermal stability than the 5-membered ring structure. Although the reason is not well understood, this is probably because the 6-membered ring structure has less structural strain.

The NIR absorbing dye of formula (1), (2) or (3) has $X^-$ as the anion. The dye is characterized in that the anion $X^-$ is a conjugate base of strong acid, which is accounted for by the following reason.

In a preferred embodiment, the NIR absorptive layer-forming composition comprises a crosslinkable resin and an acid generator so that upon baking, crosslinking reaction may occur to form a cured film. To further enhance the crosslinking ability, a conjugate base of strong acid is preferably used as the anion moiety of the acid generator. If the anion of the NIR absorbing dye having formula (1) is a conjugate base of weak acid, it may undergo an exchange reaction with the anion of the acid generator whereby the acid generator may fail to exert its own function. This is due to a phenomenon that a conjugate base of strong acid tends to form an ion pair with an onium cation. Therefore, the NIR absorbing dye according to the invention should have an anion which is a conjugate base of strong acid having an equivalent strength to the acid generator used. The conjugate base of strong acid used herein is an α-fluorosulfonic acid anion, bis(α-fluorosulfonyl)imide acid anion or tris(α-fluorosulfonyl)methide acid anion, having formula (1-1), (1-2) or (1-3).

By contrast, an inorganic anion in the form of a conjugate base of strong acid such as hexafluoroantimonate or tetrafluoroborate is not preferable because the metal impurity may be released therefrom during the semiconductor fabrication process to adversely affect the performance.

The NIR absorbing dye (A) may be synthesized according to the following scheme, for example.

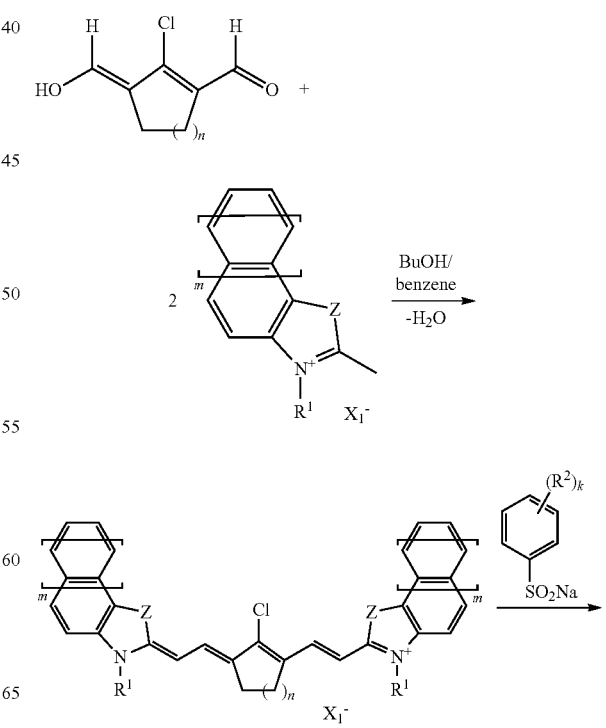

-continued

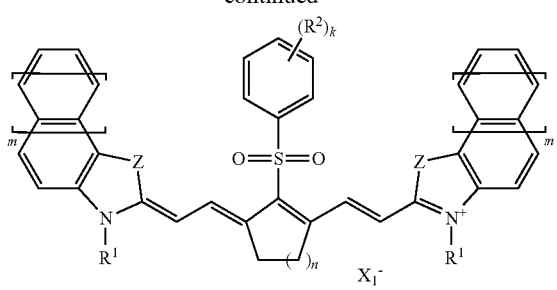

Herein $R^1$, $R^2$, k, m, n and Z are as defined above, and $X_1^-$ is an inorganic or organic anion.

With respect to the first step in the scheme, reference may be made to The Journal of Organic Chemistry, 60, 2391 (1995). The second step is to introduce aryl sulfone into the NIR absorbing dye precursor in a well-known manner. As shown in the scheme, the end compound may be synthesized by reacting the NIR absorbing dye precursor with an aryl sulfinic acid salt.

Anion $X_1^-$ may be $X^-$, i.e., a structure of any one of formulae (1-1) to (1-3), or another anion, for example, chloride or bromide ion or a weak acidic anion such as tosylate. When $X_1^-$ is another anion, it may be then exchanged with $X^-$ to derive the target compound, NIR absorbing dye. With respect to ion exchange reaction, reference should be made to JP-A 2007-145797, for example.

While the NIR absorptive layer-forming composition comprises at least one NIR absorbing dye of formula (1), (2) or (3), it may further comprise one or more other NIR absorbing dyes if desired.

The other NIR absorbing dyes used herein may be any dyes which absorb radiation in a wavelength range of 500 to 1,200 nm. Suitable other NIR absorbing dyes include the structures of the general formulae (4) to (8), but are not limited thereto.

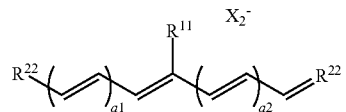

(4)

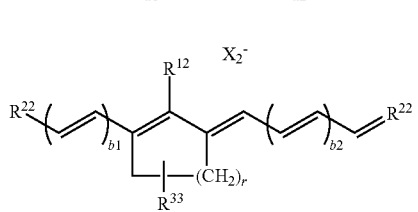

(5)

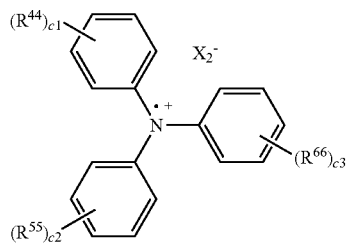

(6)

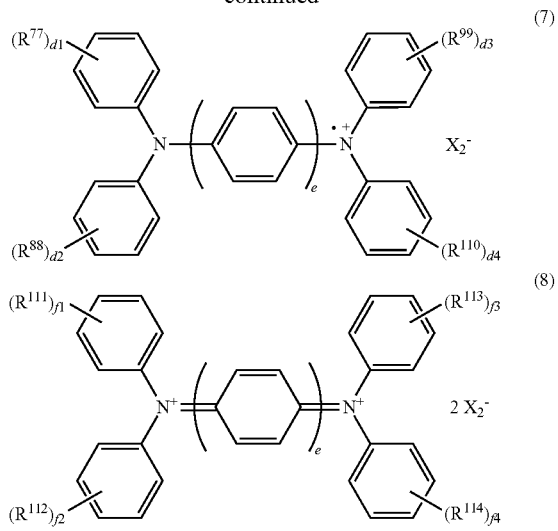

Herein, $R^{11}$ is hydrogen, halogen, cyano group, $-R^{1a}$, $-OR^{1a}$, $-SR^{1a}$, $-SO_2R^{1a}$, $-CO_2R^{1a}$, or $-N(R^{1a})_2$. $R^{12}$ is hydrogen, halogen, cyano group, $-R^{1a}$, $-OR^{1a}$, $-SR^{1a}$, $-O_2CR^{1a}$, $-CO_2R^{1a}$, or $-N(R^{1a})_2$. $R^{1a}$ is a straight, branched or cyclic $C_1$-$C_{20}$ monovalent hydrocarbon group, in which some hydrogen may be substituted by halogen or cyano group, or in which a $-CH_2-$ moiety may be replaced by an oxygen atom, sulfur atom or $-C(=O)O-$. $R^{22}$ is an organic group containing nitrogen and a cyclic structure. $R^{33}$ is a straight, branched or cyclic $C_1$-$C_5$ monovalent hydrocarbon group. $R^{44}$, $R^{55}$, and $R^{66}$ are each independently hydrogen, halogen, cyano, amino, $-R^{1a}$, $-OR^{1a}$, $-SR^{1a}$, $-CO_2R^{1a}$, or $-N(R^{1a})_2$. $R^{77}$, $R^{88}$, $R^{99}$, and $R^{110}$ are each independently hydrogen, halogen, cyano, amino, $-R^{1a}$, $-OR^{1a}$, $-SR^{1a}$, $-O_2CR^{1a}$, $-CO_2R^{1a}$, or $-N(R^{1a})_2$. $R^{111}$, $R^{112}$, $R^{113}$, and $R^{114}$ are each independently hydrogen, halogen, cyano, amino, $-R^{1a}$, $-OR^{1a}$, $-SR^1$, $-O_2CR^{1a}$, $-CO_2R^{1a}$, or $-N(R^{1a})_2$. Notably $R^{1a}$ is as defined above. $X_2^-$ is an anion. The subscripts a1 and a2 are each independently an integer of 0 to 5; b1 and b2 are each independently an integer of 0 to 5; r is 1 or 2; c1, c2 and c3 are each independently an integer of 0 to 5; d1, d2, d3, and d4 are each independently an integer of 0 to 5; e is 1 or 2; f1, f2, f3, and f4 are each independently an integer of 0 to 5.

In formulae (4) and (5), $R^{11}$ is hydrogen, halogen, cyano group, $-R^{1a}$, $-OR^{1a}$, $-SR^{1a}$, $-SO_2R^{1a}$, $-O_2CR^{1a}$, $-CO_2R^{1a}$, or $-N(R^{1a})_2$. $R^{12}$ is hydrogen, halogen, cyano group, $-R^{1a}$, $-OR^{1a}$, $-SR^{1a}$, $-O_2CR^{1a}$, $-CO_2R^{1a}$, or $-N(R^{1a})_2$. Herein $R^{1a}$ is a straight, branched or cyclic $C_1$-$C_{20}$ monovalent hydrocarbon group, in which some hydrogen may be substituted by halogen or cyano group, or in which a $-CH_2-$ moiety may be replaced by an oxygen atom, sulfur atom or $-C(=O)O-$. Examples of the monovalent hydrocarbon group are hydrocarbons including methane, ethane, propane, n-butane, n-pentane, n-hexane, n-heptane, n-octane, n-nonane, n-decane, 2-methylpropane, 2-methylbutane, 2,2-dimethylpropane, 2-methylpentane, 2-methylhexane, 2-methylheptane, cyclopentane, cyclohexane, methylcyclopentane, methylcyclohexane, ethylcyclopentane, methylcycloheptane, ethylcyclohexane, norbornane, adamantane, benzene, toluene, ethylbenzene, n-propylbenzene, 2-propylbenzene, n-butylbenzene, t-butylbenzene, n-pentylbenzene, and naphthalene, with one hydrogen atom being eliminated.

In formulae (4) and (5), $R^{22}$ is an organic group containing nitrogen and a cyclic structure, examples of which include structures of the general formulae (9) and (10).

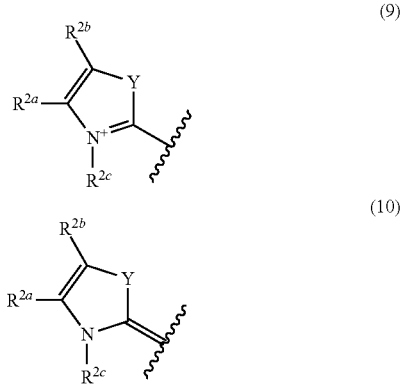

In formulae (9) and (10), $R^{2a}$ and $R^{2b}$ are each independently a straight, branched or cyclic $C_1$-$C_{20}$ monovalent hydrocarbon group in which some hydrogen may be substituted by halogen or cyano group, or in which a —$CH_2$— moiety may be replaced by an oxygen atom, sulfur atom or —C(=O)O—. $R^{2a}$ and $R^{2b}$ may bond together to form a ring, specifically a $C_5$-$C_{15}$ alicyclic or aromatic ring, with the carbon atoms to which they are attached. Y is an oxygen atom, sulfur atom or —C($R^Y$)$_2$— wherein $R^Y$ is hydrogen or a $C_1$-$C_{10}$ monovalent hydrocarbon group. $R^Y$ and $R^{2b}$ may bond together to form a ring, specifically a alicyclic or aromatic ring, with the carbon atoms to which they are attached. $R^{2c}$ is a straight, branched or cyclic $C_1$-$C_{20}$ monovalent hydrocarbon group in which some hydrogen may be substituted by halogen or cyano group, or in which a —$CH_2$— moiety may be replaced by an oxygen atom, sulfur atom or —C(=O)O—.

In formulae (4) and (5), either one of $R^{22}$ must be a cationic group like formula (9). It is excluded that both $R^{22}$ are cationic groups like formula (9).

In formula (5), $R^{33}$ is a straight, branched or cyclic $C_1$-$C_5$ monovalent hydrocarbon group. Suitable monovalent hydrocarbon groups include methyl, ethyl, n-propyl, 2-propyl, n-butyl, isobutyl, tert-butyl, n-pentyl, tert-amyl, and cyclopentyl.

In formula (6), $R^{44}$, $R^{55}$, and $R^{66}$ are each independently hydrogen, halogen, cyano, amino, —$R^{1a}$, —$OR^{1a}$, —$SR^{1a}$%, —$O_2CR^{1a}$, —$CO_2R^{1a}$, or —$N(R^{1a})_2$. Inter alia, preference is given to amino, dimethylamino, diethylamino, dipropylamino, dibutylamino, diisobutylamino, di-sec-butylamino, bis(2,2,2-trifluoroethyl)amino, bis(4,4,4-trifluorobutyl)amino, and bis(4-hydroxybutyl)amino.

In formula (7), $R^{77}$, $R^{88}$, $R^{99}$, and $R^{110}$ are each independently hydrogen, halogen, cyano, amino, —$R^{1a}$, —$OR^{1a}$, —$SR^{1a}$, —$O_2CR^{1a}$, —$CO_2R^{1a}$, or —$N(R^{1a})_2$. Inter alia, preference is given to amino, dimethylamino, diethylamino, dipropylamino, dibutylamino, diisobutylamino, di-sec-butylamino, bis(2,2,2-trifluoroethyl)amino, bis(4,4,4-trifluorobutyl)amino, and bis(4-hydroxybutyl)amino.

In formula (8), $R^{111}$, $R^{112}$, $R^{113}$, and $R^{114}$ are each independently hydrogen, halogen, cyano, amino, —$R^{1a}$, —$OR^{1a}$, —$SR^{1a}$, —$O_2CR^{1a}$, —$CO_2R^{1a}$, or —$N(R^{1a})_2$. Inter alia, preference is given to amino, dimethylamino, diethylamino, dipropylamino, dibutylamino, diisobutylamino, di-sec-butylamino, bis(2,2,2-trifluoroethyl)amino, bis(4,4,4-trifluorobutyl)amino, and bis(4-hydroxybutyl)amino.

Notably $R^{1a}$ is as defined above in conjunction with $R^{11}$.

In formulae (4) to (8), $X_2^-$ is an anion. Exemplary anions include halide ions such as chloride, bromide and iodide ions, fluoroalkylsulfonates such as triflate, 1,1,1-trifluoroethanesulfonate, pentafluoroethanesulfonate, and nonafluorobutanesulfonate, arylsulfonates such as tosylate, benzenesulfonate, 4-fluorobenzenesulfonate, and 1,2,3,4,5-pentafluorobenzenesulfonate, alkylsulfonates such as mesylate and butanesulfonate, conjugate bases of imide acids such as bis(trifluoromethylsulfonyl)imide, bis(perfluoroethylsulfonyl)imide, bis(perfluoropropylsulfonyl)imide, and bis(perfluorobutylsulfonyl)imide, conjugate bases of methide acids such as tris(trifluoromethylsulfonyl)methide and tris(perfluoroethylsulfonyl)methide, and conjugate bases of mineral acid such as $BF_4^-$, $PF_6^-$, $ClO_4^-$, $NO_3^-$, and $SbF_6^-$.

In formula (4), a1 and a2 are each independently an integer of 0 to 5, preferably 0 to 2. In formula (5), b1 and b2 are each independently an integer of 0 to 5, preferably 0 to 2, and r is 1 or 2. In formula (6), c1, c2 and c3 are each independently an integer of 0 to 5, preferably 0 to 2. In formula (7), d1, d2, d3, and d4 are each independently an integer of 0 to 5, preferably 0 to 2. In formula (8), f1, f2, f3, and f4 are each independently an integer of 0 to 5, preferably 0 to 2. In formulae (7) and (8), e is 1 or 2.

Since the NIR-absorptive layer according to the invention is formed through acid-assisted crosslinking reaction, $X_2^-$ is preferably a conjugate base of strong acid so that the layer may be more curable and dense. If a conjugate base of weak acid is used, an anion exchange with the acid from the acid generator may occur whereby the crosslinking reaction is retarded. Specifically, anions of formulae (1-1) to (1-3) are preferably used.

It is noted that the other NIR-absorbing dye may be amphoteric and in this case, $X_2^-$ is unnecessary.

Of the foregoing NIR-absorbing dyes, those cyanine dyes of formulae (4) and (5) are preferred for heat resistance and solvent solubility.

The cations of the NIR-absorbing dyes of formulae (4) to (8) are illustrated by the following exemplary structures, but not limited thereto.

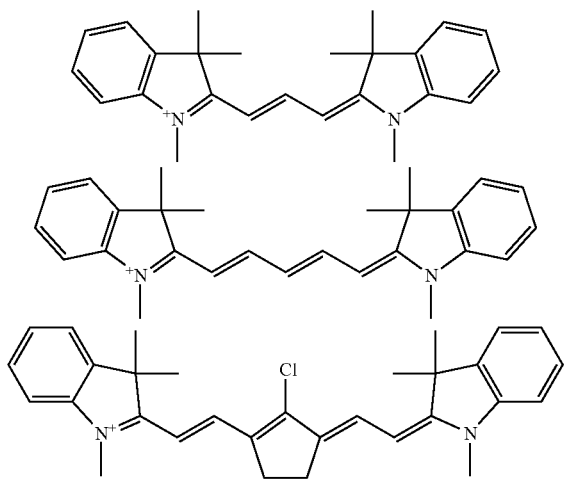

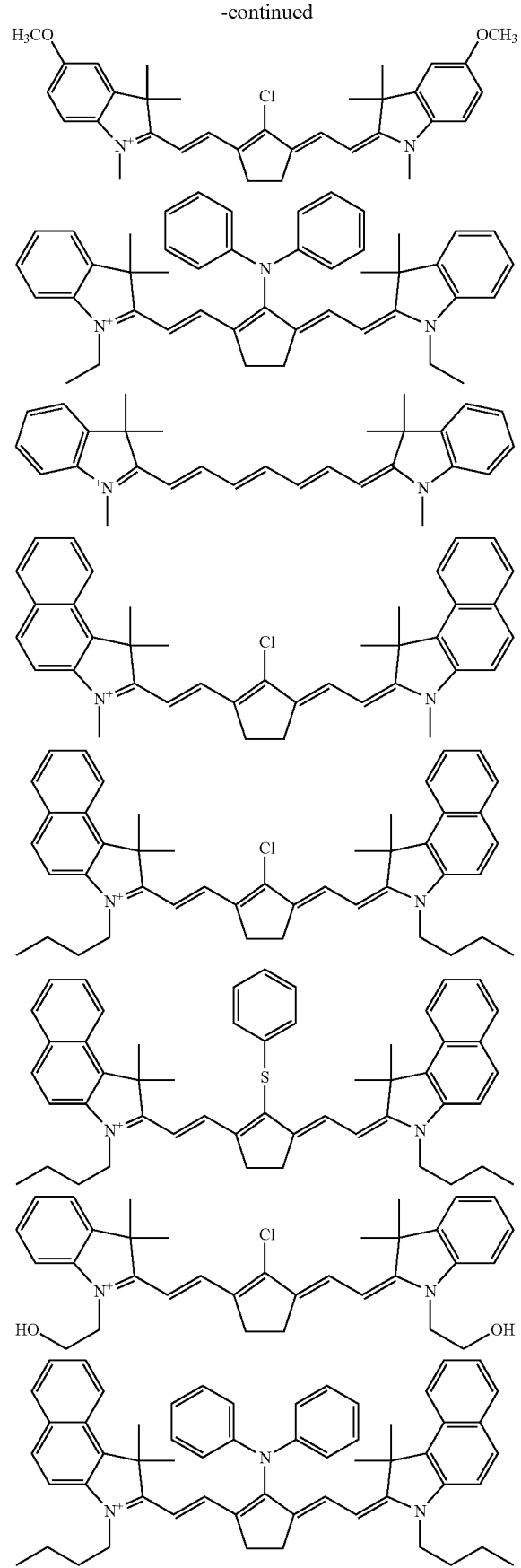
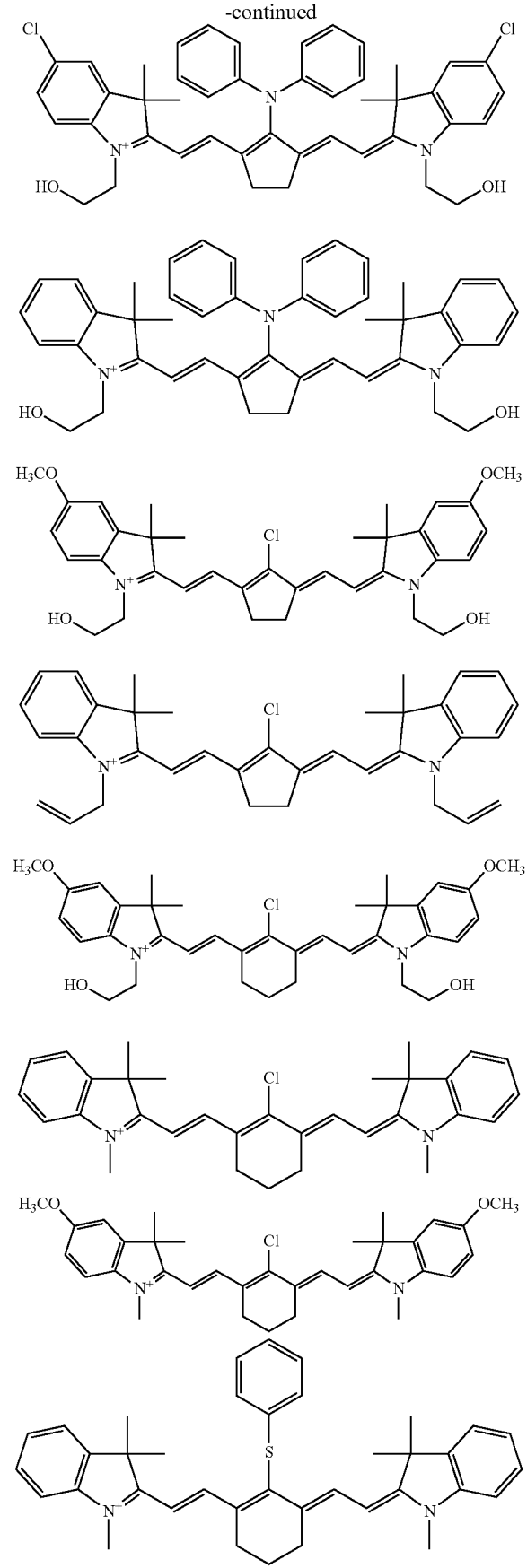

25
-continued
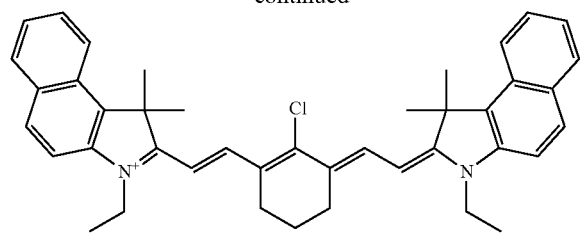
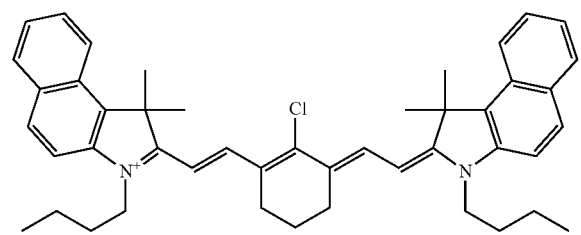
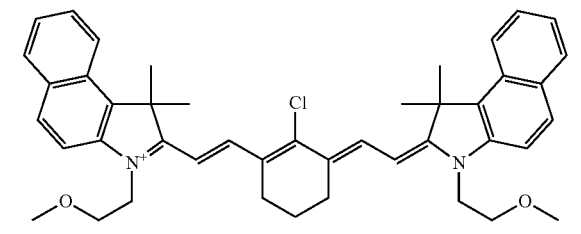
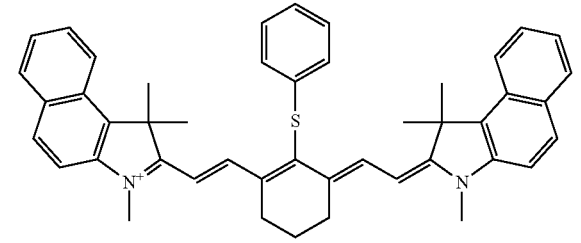
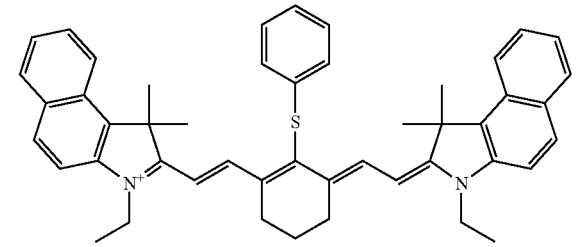
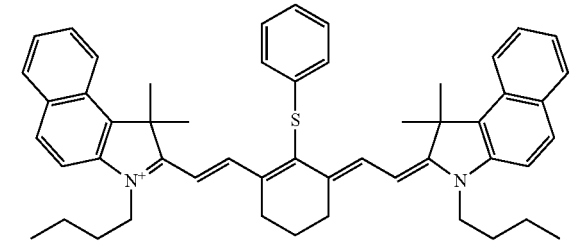
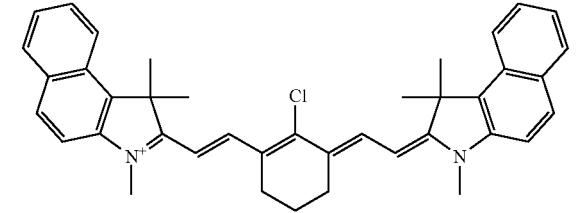
26
-continued
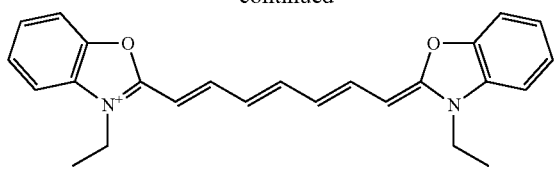
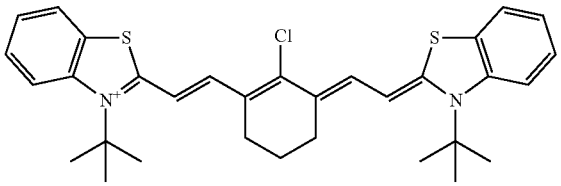
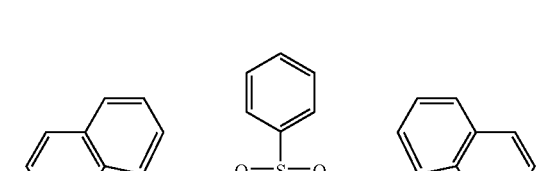
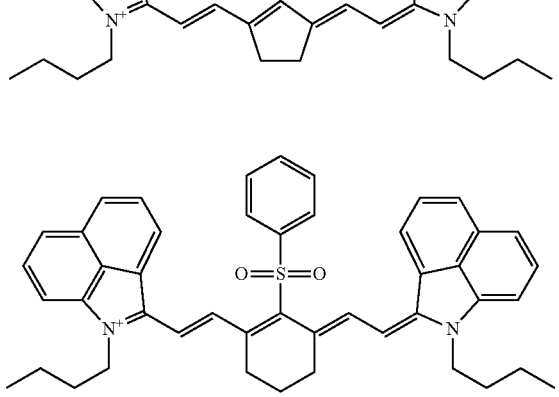
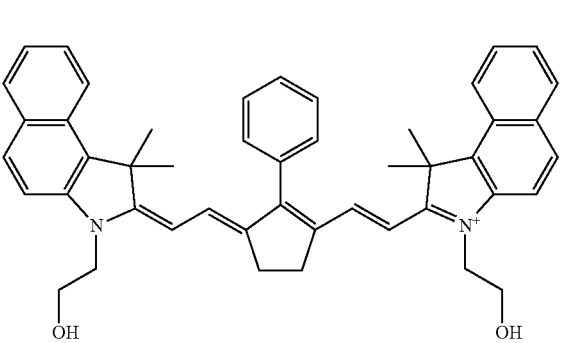
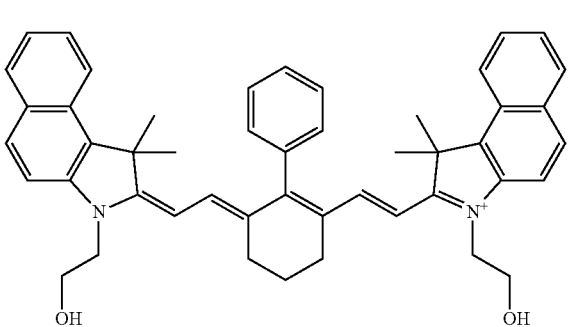

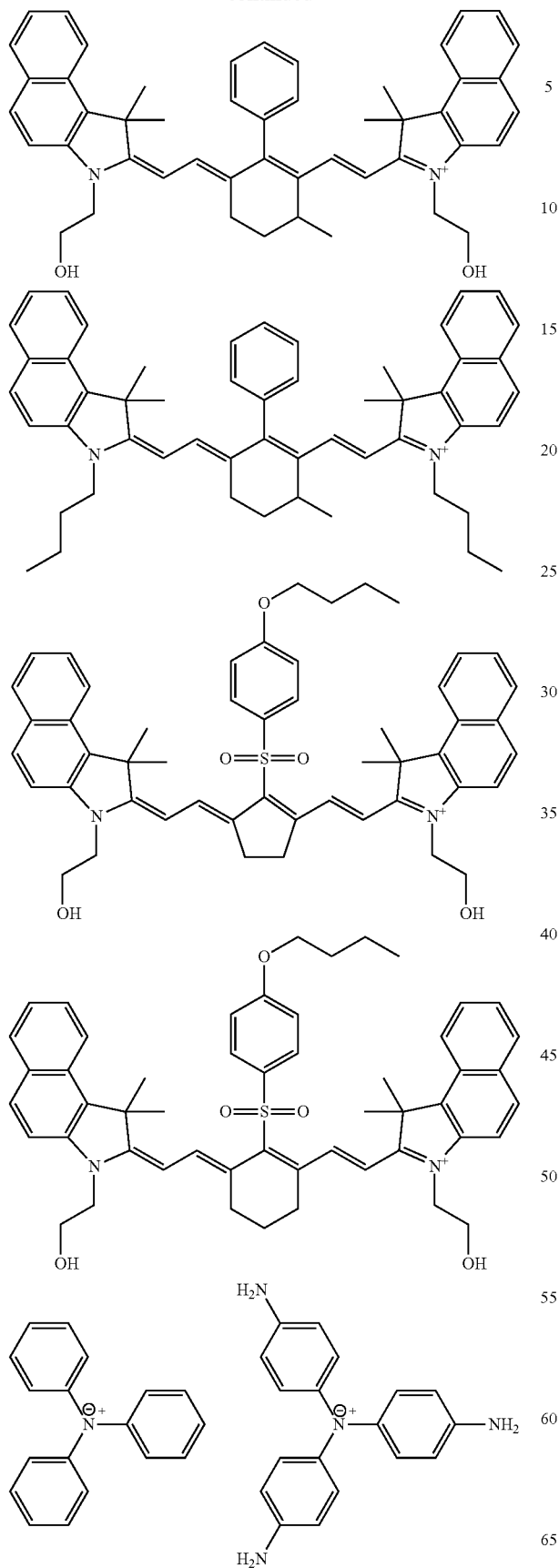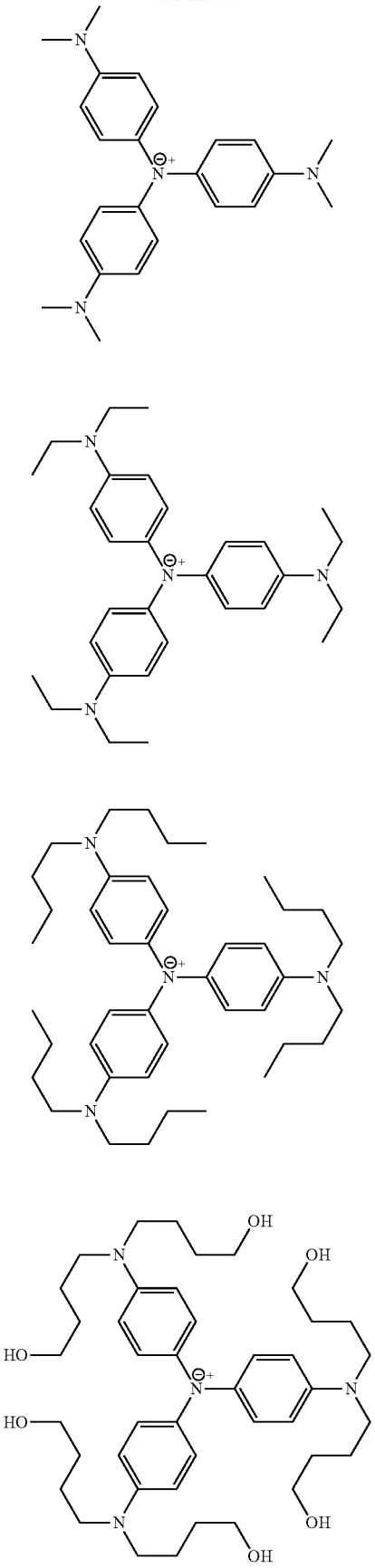

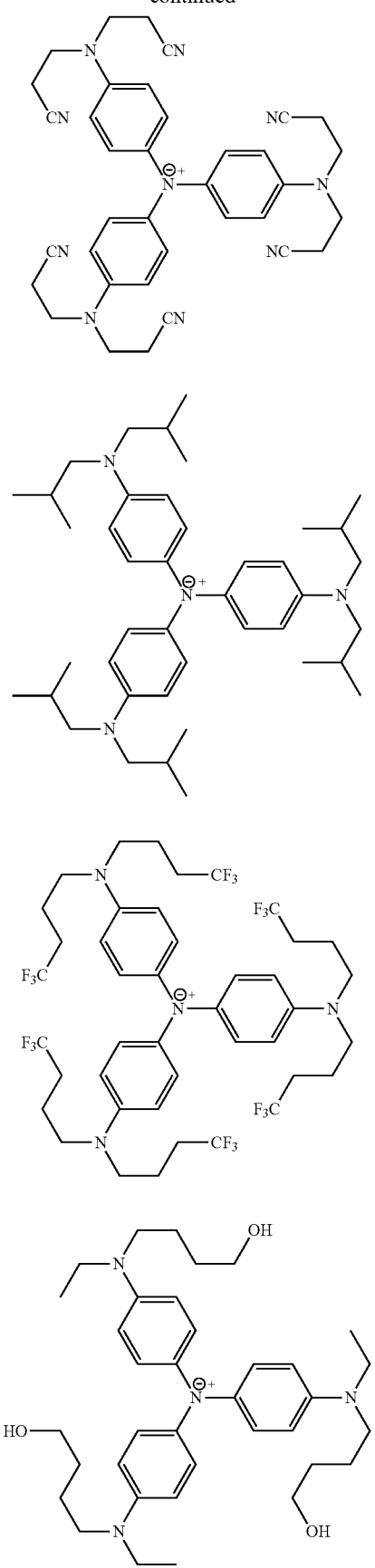
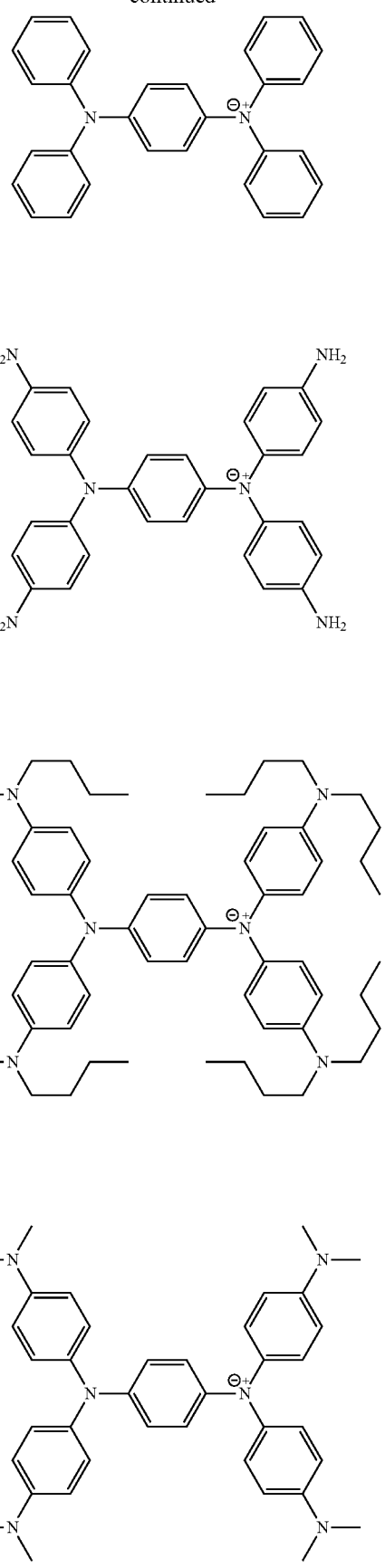

-continued
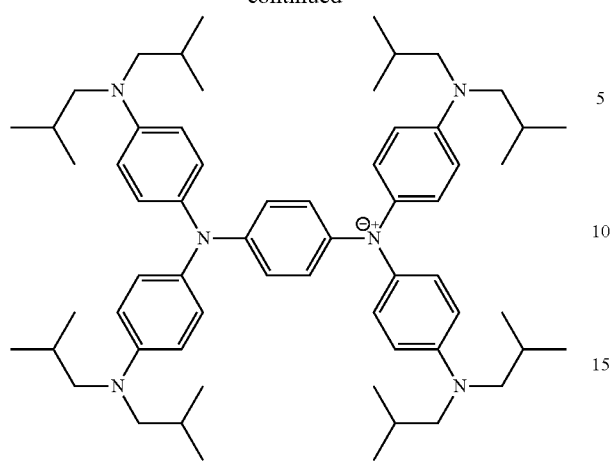
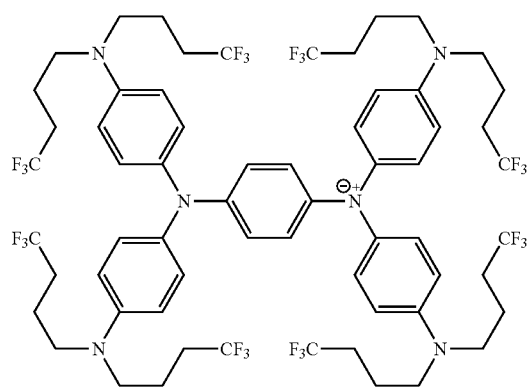
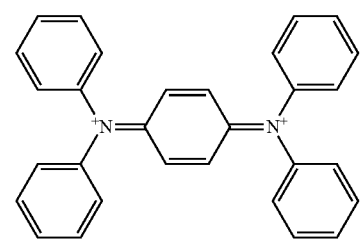
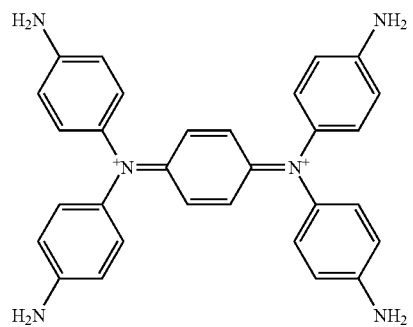
-continued
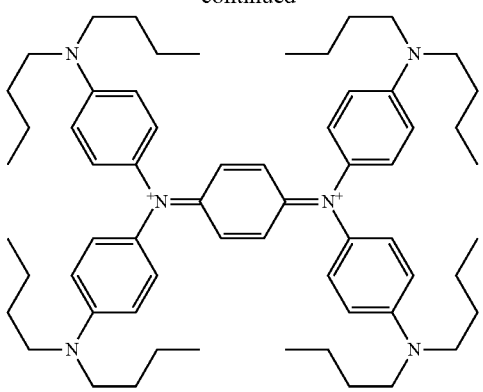
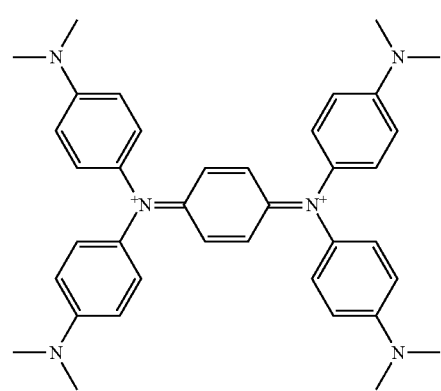
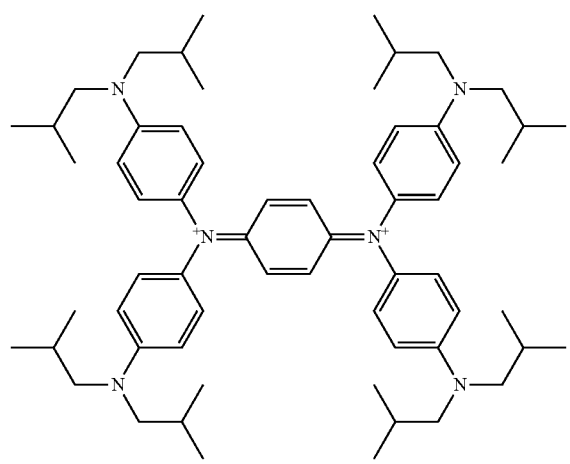
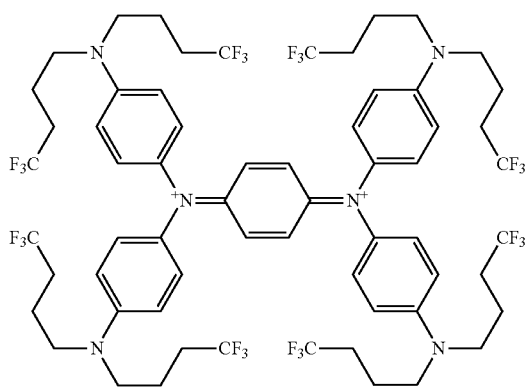

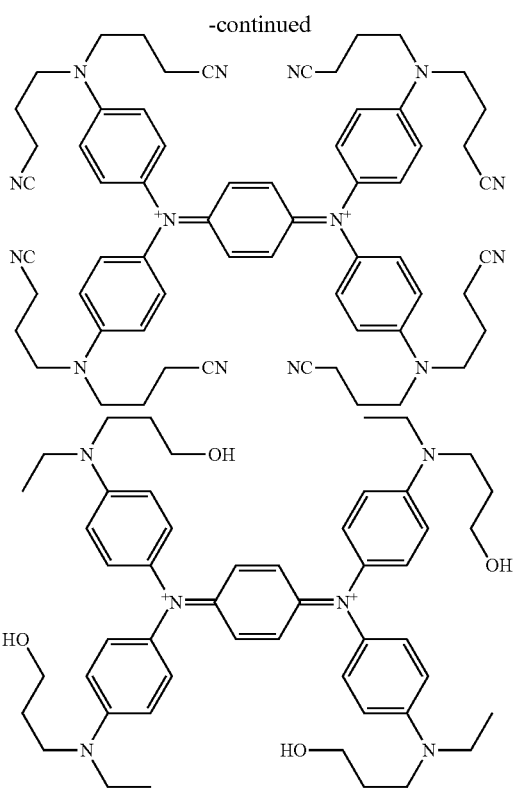

Examples of the ampho-ion structure are illustrated below, but not limited thereto.

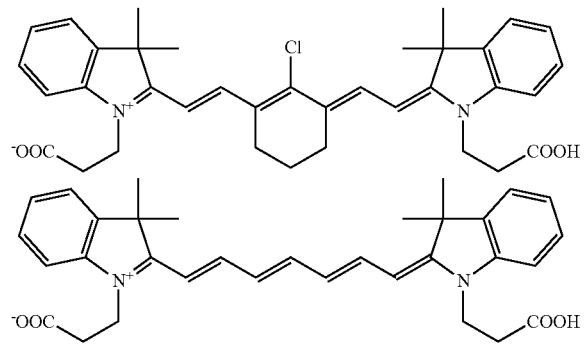

As the NIR-absorbing dye, commercially available dyes may be used as purchased, or derivatives using them as the precursor may be used. They may also be prepared by any well-known organic chemical formulation.

In the NIR absorptive layer-forming composition, the NIR-absorbing dye is preferably used in an amount of 20 to 300 parts, more preferably 49 to 100 parts by weight per 100 parts by weight of the overall polymer. For achieving the objects of the invention, the NIR-absorbing dye of formula (1) should preferably account for 50 to 100% by weight, more preferably 60 to 100% by weight based on the total weight of the NIR-absorbing dye or dyes.

B) Polymer

The NIR absorptive layer-forming composition comprises at least one polymer as component (B). The polymer (B) should preferably comprise repeat units of at least one type which undergo crosslinking reaction in the presence of acid for forming a denser NIR-absorptive layer, for example, repeat units of at least one type containing a hydroxyl group, cyclic ether structure such as oxirane or oxetane, or carboxyl group. When the polymer (B) comprises repeat units capable of crosslinking reaction, a hard, dense NIR-absorptive layer can be formed, which is effective for preventing the NIR-absorptive layer from being thinned and the NIR-absorbing dye from being leached out of the layer when another layer such as a silicon-containing layer is deposited directly thereon. Among others, oxirane or oxetane structure-bearing repeat units which undergo crosslinking reaction in the presence of acid are most preferred because they have high acid reactivity and enable to form a dense layer.

Examples of suitable repeat units which undergo crosslinking reaction in the presence of acid are given below, but not limited thereto.

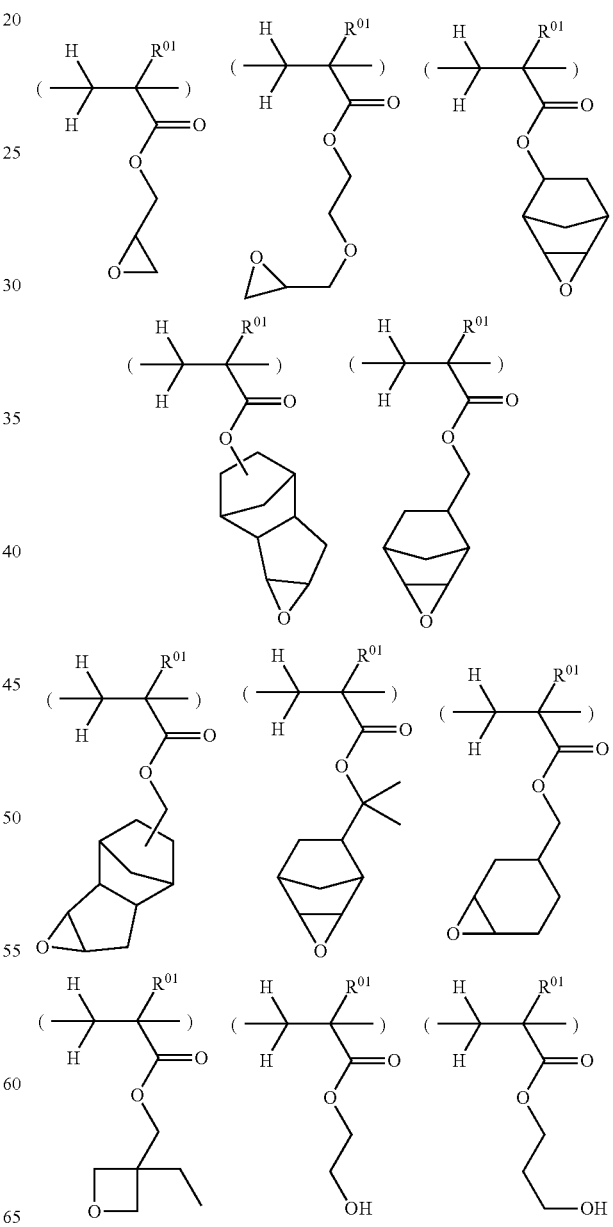

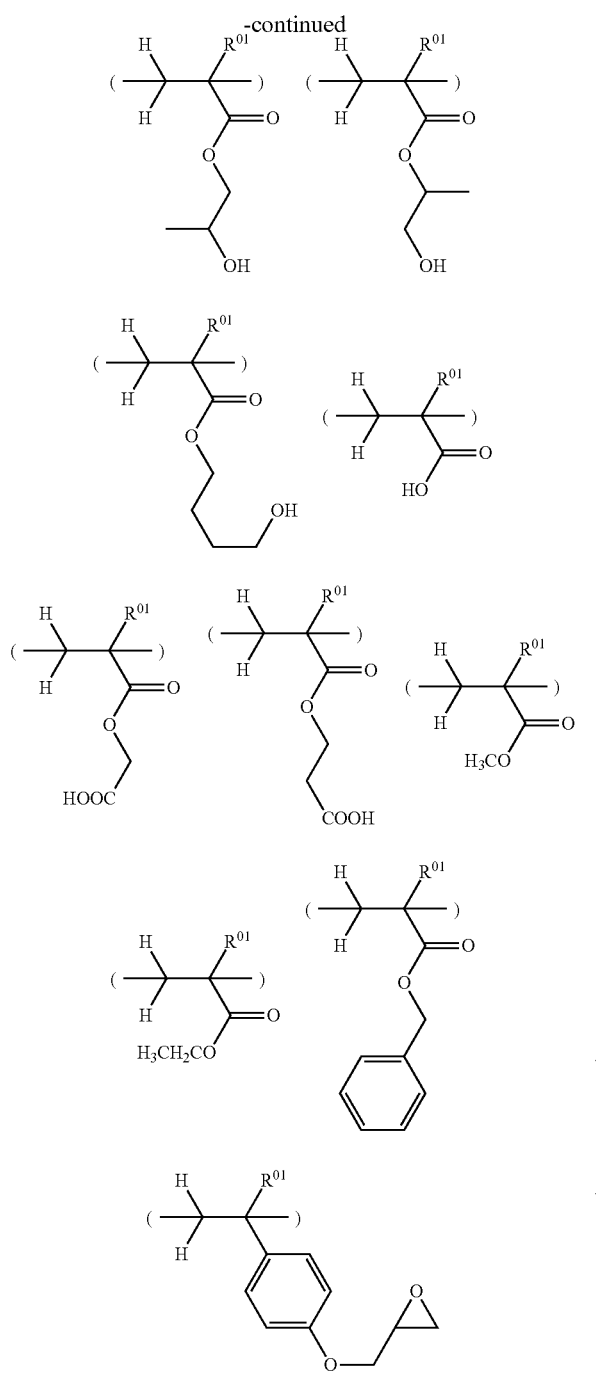
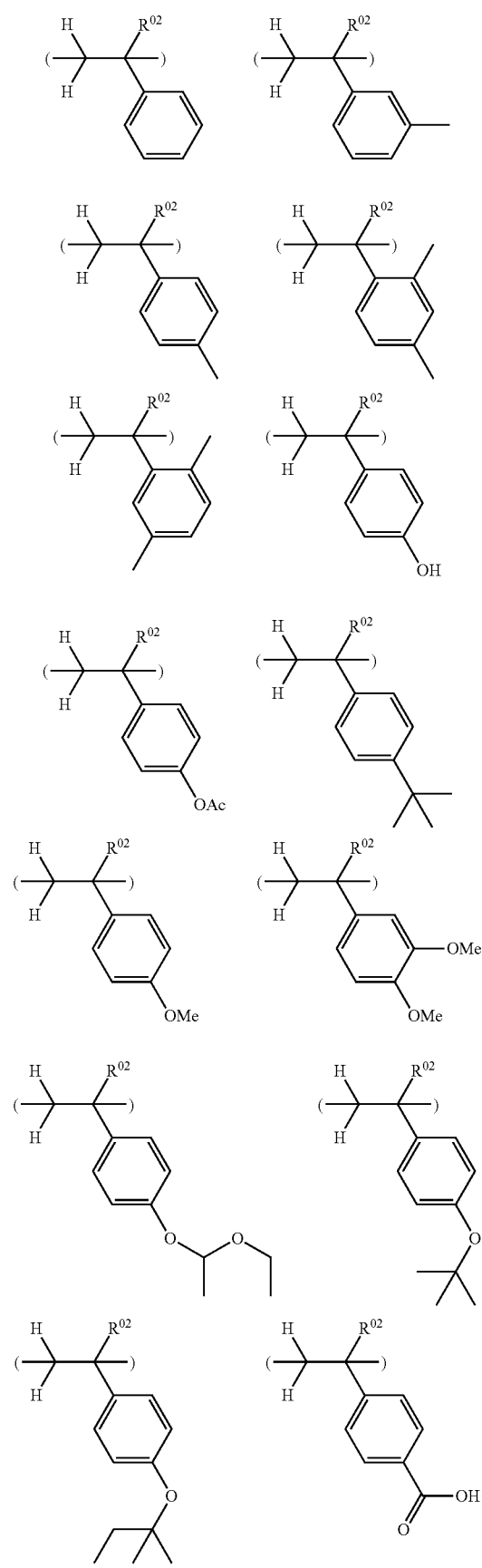

Herein R$^{01}$ is hydrogen, methyl, fluorine, hydroxymethyl or trifluoromethyl.

In the polymer (B), aromatic ring-bearing repeat units may be incorporated for tailoring optical properties including a refractive index (n) and an extinction coefficient (k). Optical properties suited to absorb NIR light used in optical autofocusing are obtainable by introducing aromatic ring-bearing repeat units into a polymer to and adjusting the amount of the polymer relative to the NIR absorbing dye. Further, optical properties necessary for the NIR absorptive film to serve as an antireflective coating for exposure light are concurrently available. Examples of aromatic ring-bearing repeat units are given below, but not limited thereto.

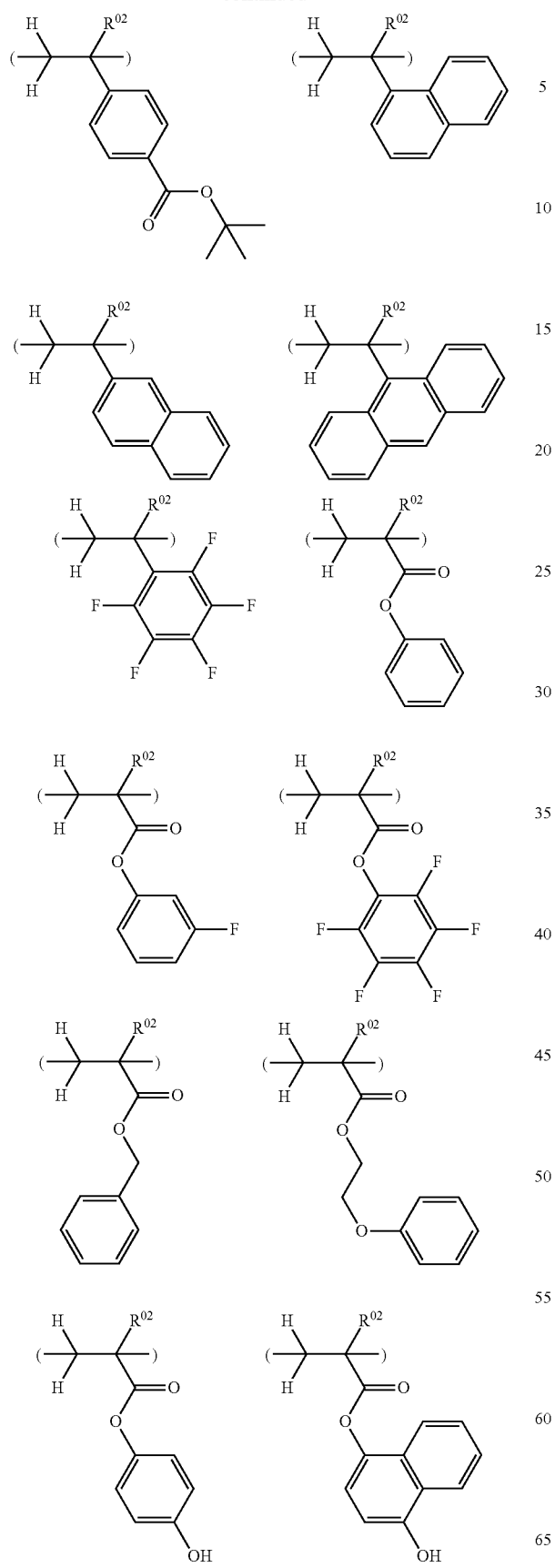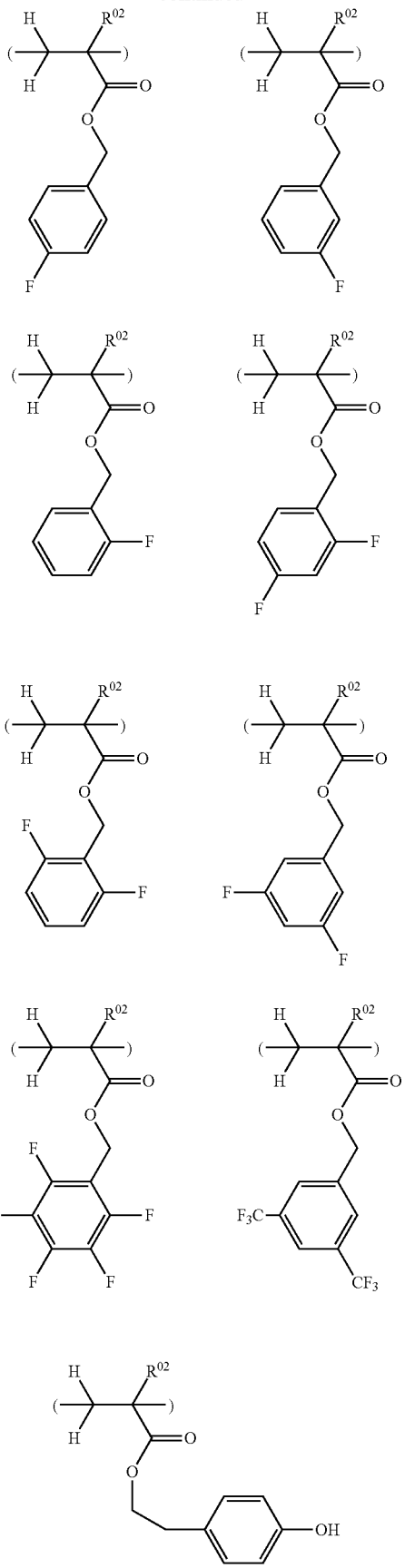

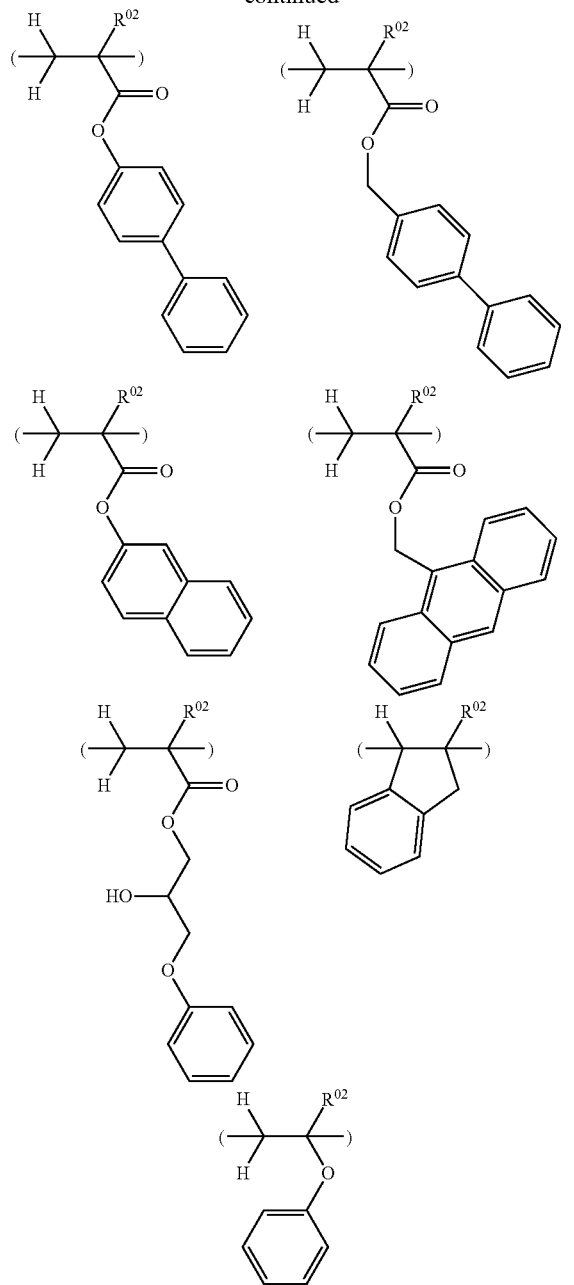

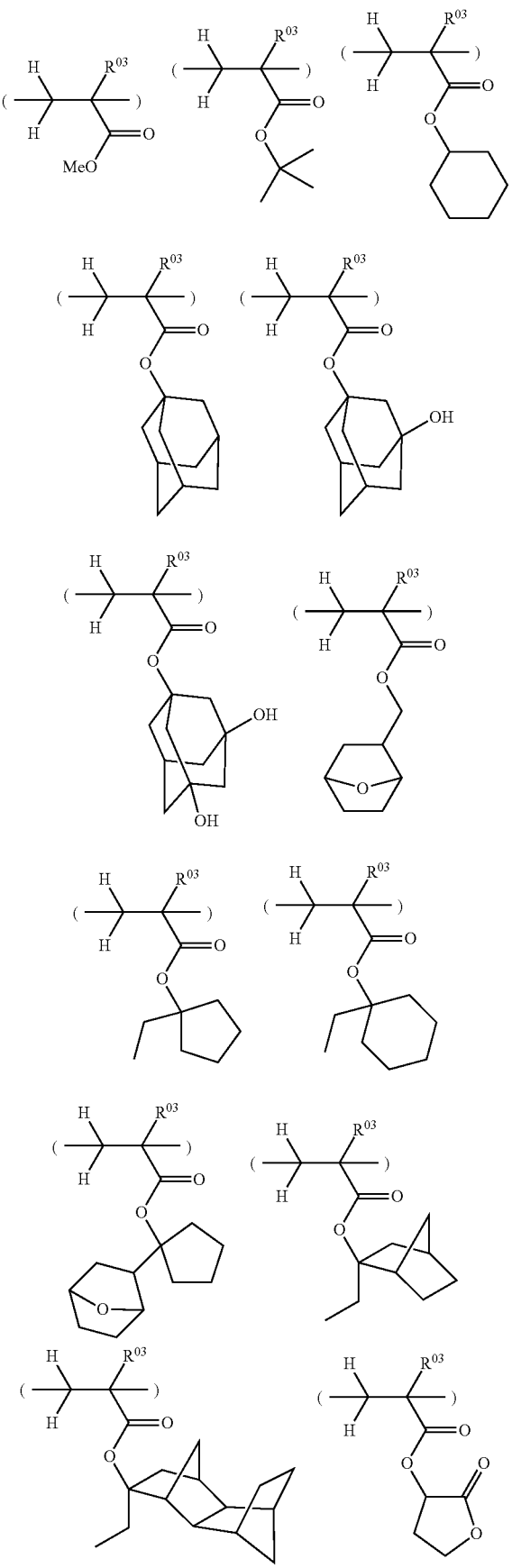

Herein $R^{02}$ is hydrogen, methyl, fluorine or trifluoromethyl, Me stands for methyl, and Ac stands for acetyl.

When a NIR absorptive layer is formed using the NIR absorptive layer-forming composition, a certain combination of a polymer with a NIR absorbing dye may result in defective layer formation, failing in coverage of the entire wafer surface with a layer of a uniform thickness. To avoid such a phenomenon, repeat units of at least one type commonly used in the base resin of photoresist material, for example, repeat units having an acid labile group, lactone structure-bearing repeat units, hydroxyl-bearing repeat units, hydrocarbon-bearing repeat units, and halogen-bearing repeat units may be incorporated into the polymer. For the same purpose, repeat units of at least one type derived from such monomers as substituted (meth)acrylates, substituted norbornenes, and unsaturated acid anhydrides may also be incorporated. Examples of these repeat units are given below, but not limited thereto.

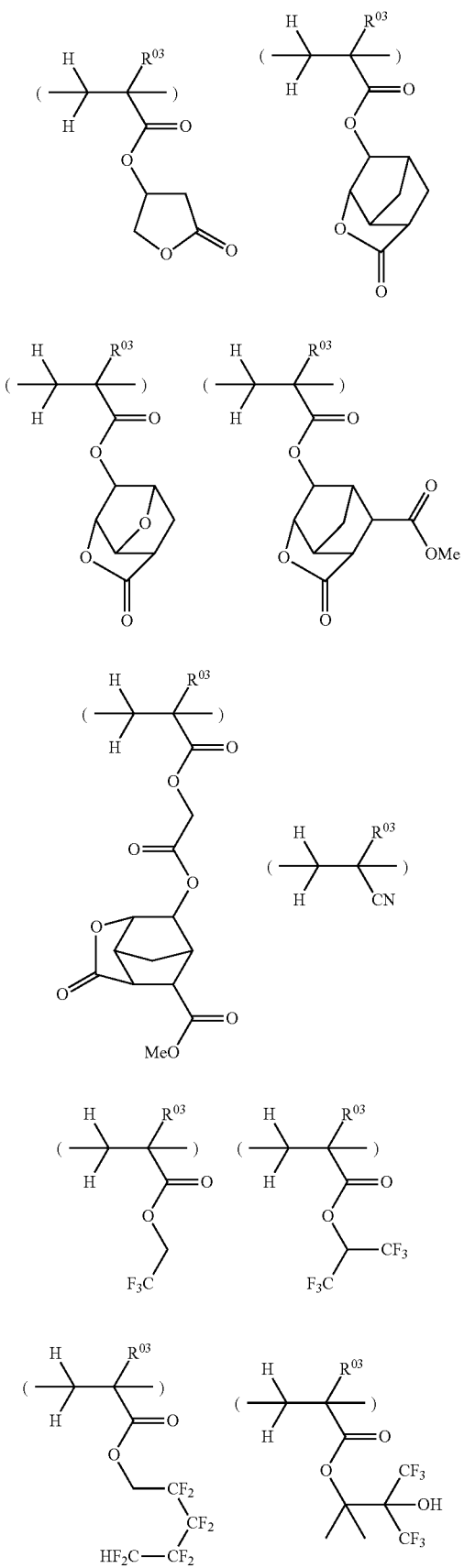
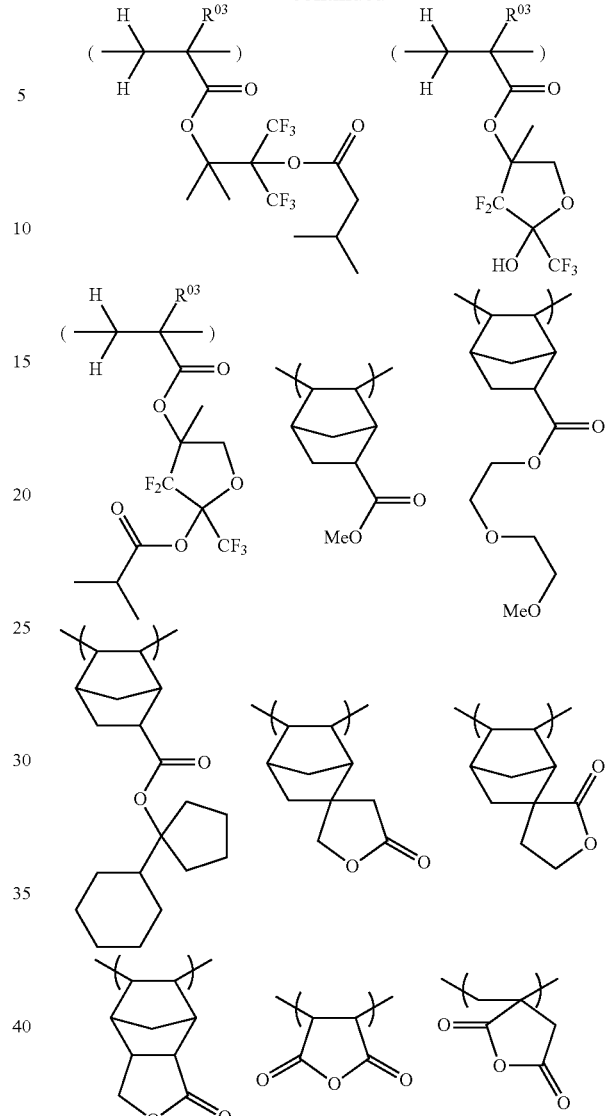

Herein R03 is hydrogen, methyl, fluorine or trifluoromethyl, and Me stands for methyl.

The polymer (B) may comprise individual repeat units in a preferred compositional proportion range as shown below, but is not limited thereto. Specifically, the polymer may preferably comprise:

5 to 90 mol %, more preferably 8 to 80 mol %, and even more preferably 10 to 70 mol %, in total, of repeat units which undergo acid-assisted crosslinking reaction, 5 to 90 mol %, more preferably 8 to 80 mol %, and even more preferably 10 to 70 mol %, in total, of aromatic ring-bearing repeat units, and 0 to 40 mol %, more preferably 1 to 30 mol %, and even more preferably 3 to 20 mol %, in total, of other repeat units, provided that these units total to 100 mol %.

Monomers for forming the polymer (B) are commercially available. They may also be prepared using any well-known organic chemistry formulation.

The polymerization reaction to produce the polymer (B) may be any of well-known polymerization reactions, but preferably radical polymerization. For radical polymerization, preferred reaction conditions include (1) a solvent selected from hydrocarbon solvents such as benzene, toluene and xylene, glycol solvents such as propylene glycol monomethyl ether and propylene glycol monomethyl ether acetate, ether solvents such as diethyl ether, diisopropyl ether, dibutyl ether, tetrahydrofuran, and 1,4-dioxane, ketone solvents such as acetone, methyl ethyl ketone, methyl isobutyl ketone and methyl amyl ketone, ester solvents such as ethyl acetate, propyl acetate, butyl acetate and ethyl lactate, lactone solvents such as γ-butyrolactone, and alcohol solvents such as ethanol and isopropyl alcohol; (2) a polymerization initiator selected from well-known radical polymerization initiators including azo compounds such as 2,2'-azobisisobutyronitrile, 2,2'-azobis-2-methylisobutyronitrile, dimethyl 2,2'-azobisisobutyrate, 2,2'-azobis-2,4-dimethylvaleronitrile, 1,1'-azobis(cyclohexane-1-carbonitrile), and 4,4'-azobis(4-cyanovaleric acid), and peroxides such as lauroyl peroxide and benzoyl peroxide; (3) a radical chain transfer agent, if necessary for molecular weight control, selected from thiol compounds including 1-butanethiol, 2-butanethiol, 2-methyl-1-propanethiol, 1-octanethiol, 1-decanethiol, 1-tetradecanethiol, cyclohexanethiol, 2-mercaptoethanol, 1-mercapto-2-propanol, 3-mercapto-1-propanol, 4-mercapto-1-butanol, 6-mercapto-1-hexanol, 1-thioglycerol, thioglycolic acid, 3-mercaptopropionic acid, and thiolactic acid; (4) a reaction temperature in the range of about 0° C. to about 140° C.; and (5) a reaction time in the range of about 0.5 to about 48 hours. Reaction parameters outside these ranges need not be excluded.

The polymer (B) preferably has a weight average molecular weight (Mw) of 1,000 to 200,000, and more preferably 2,000 to 180,000, as measured by gel permeation chromatography (GPC) versus polystyrene standards. A polymer having too high a Mw may not dissolve in a solvent or may dissolve in a solvent to form a solution, which may be less effective to coat, failing to form a layer of uniform thickness over the entire wafer surface. Also, when a polymer layer is formed on a patterned substrate, the layer may fail to cover the pattern without leaving voids. On the other hand, a polymer having too low a Mw may have a problem that when a polymer layer is overlaid with another layer, the polymer layer is in part washed away and thinned.

C) Solvent

The NIR absorptive layer-forming composition comprises at least one solvent. The solvent used herein may be any organic solvent in which the NIR absorbing dye (A), polymer (B), acid generator, crosslinker, surfactant and other components are soluble. Illustrative, non-limiting, examples of the organic solvent include ketones such as cyclohexanone and methyl-2-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, preferred are PGMEA, cyclohexanone, γ-butyrolactone, and mixtures thereof.

The organic solvent is preferably added in an amount of 900 to 20,000 parts by weight, more preferably 1,000 to 15,000 parts by weight per 100 parts by weight of the overall polymer.

While the NIR absorptive layer-forming composition is defined as comprising (A) a NIR absorbing dye, (B) a polymer, and (C) a solvent, all defined above, it may optionally further comprise (D) an acid generator, (E) a crosslinker, and/or (F) a surfactant.

D) Acid Generator

In the NIR absorptive film-forming composition, an acid generator may be added for the purpose of promoting thermally or otherwise induced crosslinking reaction. The acid generators include those capable of generating an acid through thermal decomposition (thermal acid generators) and those capable of generating an acid upon light exposure (photoacid generators). Although acid generators of either category may be added, the thermal acid generators are preferred.

Suitable acid generators used herein include sulfonium salts, iodonium salts, ammonium salts, and diazomethanes. While any of these acid generators may be used herein, typical acid generators are illustrated in JP-A 2008-083668. The preferred acid generators are onium salts having α-fluoro-substituted sulfonate as an anion including triethylammonium nonafluorobutanesulfonate, (p-methoxyphenylmethyl) dimethylphenylammonium trifluoromethanesulfonate, bis(p-tert-butylphenyl)iodonium nonafluorobutanesulfonate, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, and 1,2'-naphthylcarbonylmethyltetrahydrothiophenium triflate. The acid generators may be used alone or in admixture of two or more.

The acid generator is preferably added in an amount of 0.1 to 50 parts by weight, more preferably 0.5 to 40 parts by weight per 100 parts by weight of the overall polymer. Less than 0.1 pbw of the acid generator may generate an acid in an amount insufficient to promote crosslinking reaction whereas more than 50 pbw may give rise to a mixing phenomenon that the acid will migrate into the overlying layer.

E) Crosslinker

To the NIR absorptive layer-forming composition, a crosslinker is preferably added. A NIR absorptive layer formed of the composition is desired to avoid intermixing with any overlying layer, typically resist layer, and to prevent diffusion of low molecular weight components. These goals may be attained by the method of applying the NIR absorptive layer-forming composition onto a substrate by a coating technique such as spin coating, and then baking to induce thermal crosslinking to form a cured film. This method becomes employable if a crosslinker is added to the NIR absorptive layer-forming composition or if a crosslinkable substituent group is introduced into the polymer.

Suitable crosslinkers which can be separately added herein include melamine compounds, guanamine compounds, glycoluril compounds and urea compounds having substituted thereon at least one group selected from among methylol, alkoxymethyl and acyloxymethyl groups, epoxy compounds, isocyanate compounds, azide compounds, and compounds having a double bond such as an alkenyl ether group. Acid anhydrides, oxazoline compounds, and compounds having a plurality of hydroxyl groups are also useful as the crosslinker. Typical crosslinkers are illustrated in JP-A 2009-098639.

Preferred examples of the crosslinker include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof.

To the NIR absorptive layer-forming composition, the crosslinker is, preferably added in an amount of 0 to 50 parts by weight, more preferably 1 to 40 parts by weight per 100 parts by weight of the overall polymer. An appropriate amount of the crosslinker is effective for curing a layer. However, if the amount is more than 50 pbw, part of the crosslinker may be released as outgas upon film formation, causing contamination to the exposure apparatus. The crosslinkers may be used alone or in admixture of two or more.

F) Surfactant

In a preferred embodiment, the NIR absorptive layer-forming composition further comprises a surfactant. Illustrative, non-limiting, examples of the surfactant (F) include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Jemco Co., Ltd.), Megaface F171, F172, F173, R08 and R30 (DIC Corp.), Fluorad FC-430, FC-431, FC-4430 and FC-4432 (3M Sumitomo Co., Ltd.), Asahiguard AG710, Surflon S-381, S-382, SC101, SC102, SC103, SC104, SC105, SC106, KH-10, KH-20, KH-30 and KH-40 (Asahi Glass Co., Ltd.), and Surfynol E1004 (Nissin Chemical Industry Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Kagaku Kogyo Co., Ltd.). Additional useful surfactants include partially fluorinated oxetane ring-opened polymers having the structural formula (surf-1).

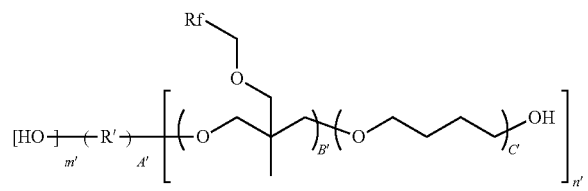

(surf-1)

In formula (surf-1), R' is a di- to tetra-valent $C_2$-$C_5$ aliphatic group. Exemplary divalent groups include ethylene, 1,4-butylene, 1,2-propylene, 2,2-dimethyl-1,3-propylene and 1,5-pentylene. Exemplary tri- and tetra-valent groups are shown below.

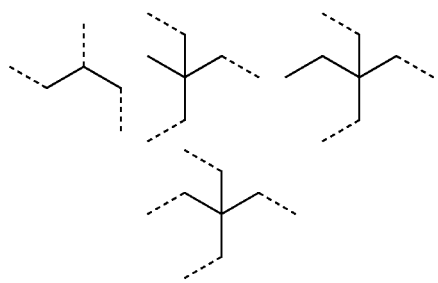

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferably used.

Rf is trifluoromethyl or pentafluoroethyl, and preferably trifluoromethyl. The letter m' is an integer of 0 to 3, n' is an integer of 1 to 4, and the sum of m' and n', which represents the valence of R', is an integer of 2 to 4. A' is equal to 1, B' is an integer of 2 to 25, and C' is an integer of 0 to 10. Preferably, B' is an integer of 4 to 20, and C' is 0 or 1. Note that the above structural formula does not prescribe the arrangement of respective constituent units while they may be arranged either in blocks or randomly. For the preparation of surfactants in the form of partially fluorinated oxetane ring-opened polymers, reference should be made to U.S. Pat. No. 5,650,483, for example.

Of the foregoing surfactants, FC-4430, Surflon S-381, Surfynol E1004, KH-20, KH-30, and oxetane ring-opened polymers of formula (surf-1) are preferred. These surfactants may be used alone or in admixture.

To the NIR absorptive layer-forming composition, the surfactant is preferably added in an amount of up to 2 parts, more preferably up to 1 part by weight, relative to 100 parts by weight of the overall polymer. When the surfactant is used, the amount is preferably at least 0.0001 pbw, more preferably at least 0.001 pbw.

When the NIR absorptive layer-forming composition is coated, the resulting layer contains the dye capable of absorbing radiation in a wavelength range of 500 to 1,200 nm so that it may function as a layer for absorbing NIR radiation used in optical autofocus method.

Another embodiment of the invention is a multilayer film comprising a NIR absorptive layer which is formed typically on a substrate by coating the NIR absorptive layer-forming composition, and a photoresist layer which is formed typically on the NIR absorptive layer by coating a photoresist composition. In the practice of optical auto-focusing, the multilayer film prevents the NIR light transmitted by the resist layer from being reflected from the substrate and entering the focus detection system. This improves the accuracy of optical auto-focusing. Since the optical autofocus method used in the existing semiconductor fabrication site is applicable without substantial changes, the time taken for the method falls within a practically acceptable range.

The NIR absorptive layer is preferably used as an antireflective coating for exposure radiation used in optical lithography. Then the wafer layer stacking process currently used in the industry can be used without substantial modifications.

Due to thinning of resist layer and an etching selective ratio between resist layer and processable substrate, processing becomes more difficult. One current approach for obviating such difficulty is a trilayer process that uses a trilayer structure including a resist layer, a silicon-containing layer underneath the resist layer, and an underlayer (organic planarization layer or OPL) having a high carbon density and high etch resistance underneath the silicon-containing layer. On etching with oxygen gas, hydrogen gas or ammonia gas, a high etching selective ratio is established between the Si-containing layer and the underlayer, allowing the Si-containing layer to be thinned. Also the etching selective ratio between the single-layer resist layer and the Si-containing layer is relatively high, allowing the single-layer resist layer to be thinned. The reflection of exposure light may be effectively prevented by adjusting optical properties of these three layers.

When the NIR absorptive layer serves as the antireflective coating layer, it is most preferably used as the underlayer.

The method of forming a NIR absorptive layer according to the invention is described. Like conventional photoresist layers, the NIR absorptive layer can be formed on a substrate by any suitable coating techniques including spin coating, roll coating, flow coating, dip coating, spray coating, and doctor coating. Once the NIR absorptive layer-forming composition is coated, the organic solvent is evaporated off and bake is preferably effected to promote crosslinking reaction in order to prevent intermixing with any overlying layer subsequently coated thereon. The bake is preferably at a temperature of 100 to 350° C. for a time of 10 to 300 seconds. While the thickness of the antireflective coating layer may be selected appropriate for enhancing the NIR absorbing effect, it preferably has a thickness of 10 to 200 nm, more preferably 20 to 150 nm. When the NIR absorptive layer is used as an underlayer, it preferably has a thickness of 3 to 500 nm, more preferably 5 to 400 nm. An appropriate thickness may be selected within the range so as to enhance the NIR absorbing effect.

The Si-containing layer of the multilayer film may be formed by coating and baking or CVD. When the layer is formed by the coating method, silsesquioxane or polyhedral oligomeric silsesquioxane (POSS) is used. In the case of CVD, various silane gases are used as the reactant. The Si-containing layer may have a light-absorptive anti-reflecting function and in this case, it may contain a light absorptive group such as phenyl or it may be a SiON layer. An organic layer may intervene between the Si-containing layer and the resist layer. In this embodiment, the organic layer may be an antireflective coating layer. Although the thickness of the Si-containing layer is not particularly limited, it preferably has a thickness of 10 to 100 nm, and more preferably 20 to 80 nm.

The multilayer film includes a photoresist layer which is formed typically on the NIR absorptive layer by coating a photoresist composition. The photoresist composition may be any of well-known photoresist compositions as described, for example, in JP-A H09-73173 and JP-A 2000-336121.

The resist layer may be formed by applying such a photoresist composition by any suitable coating techniques including spin coating, roll coating, flow coating, dip coating, spray coating, and doctor coating, and prebaking preferably on a hot plate at 50 to 150° C. for 1 to 10 minutes, more preferably at 60 to 140° C. for 1 to 5 minutes, thereby forming a resist layer of 0.01 to 2.0 μm thick.

In the event the immersion lithography using water is applied to the resist composition used herein, particularly in the absence of a resist protective layer, the resist composition may have added thereto a surfactant having a propensity to segregate at the resist surface after spin coating for achieving a function of minimizing water penetration or leaching. The preferred surfactant is a polymeric surfactant which is insoluble in water, but soluble in alkaline developer, and especially which is water repellent and enhances water slippage. Suitable polymeric surfactants are shown below.

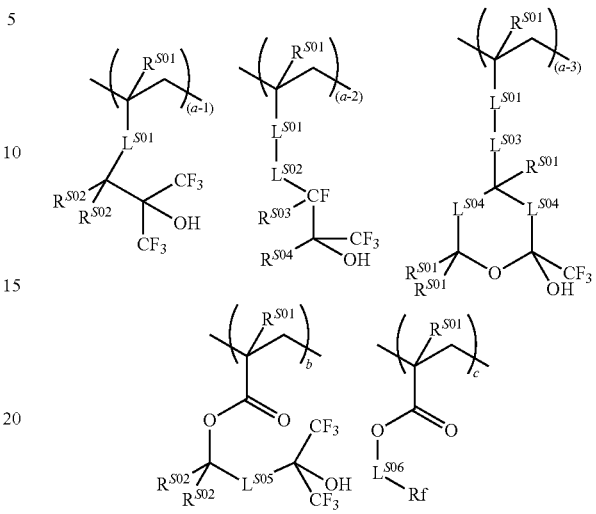

Herein $L^{S01}$ is each independently —C(=O)—O—, —O—, or —C(=O)-$L^{S07}$-C(=O)—O— wherein $L^{S07}$ is a straight, branched or cyclic $C_1$-$C_{10}$ alkylene group. $R^{S01}$ is each independently hydrogen, fluorine, methyl or trifluoromethyl. $R^{S02}$ is each independently hydrogen or a straight, branched or cyclic $C_1$-$C_{20}$ alkyl or fluoroalkyl group, or two $R^{S02}$ in a common unit may bond together to form a ring with the carbon atom to which they are attached, and in this event, they together represent a straight, branched or cyclic alkylene or fluoroalkylene group of 2 to 20 carbon atoms in total. $R^{S03}$ is fluorine or hydrogen, or $R^{S03}$ may bond with $L^{S02}$ in a common unit to form a $C_3$-$C_{10}$ non-aromatic ring with the carbon atom to which they are attached. $L^{S02}$ is a straight, branched or cyclic $C_1$-$C_6$ alkylene group in which at least one hydrogen atom may be substituted by a fluorine atom. $R^{S04}$ is a straight or branched $C_1$-$C_{10}$ alkyl group in which at least one hydrogen atom is substituted by a fluorine atom. Alternatively, $L^{S02}$ and $R^{S04}$ may bond together to form a non-aromatic ring with the carbon atoms to which they are attached, and in this event, the ring represents a trivalent organic group of 2 to 12 carbon atoms in total. $L^{S03}$ is a single bond or a $C_1$-$C_4$ alkylene. $L^{S04}$ is each independently a single bond, —O—, or —$CR^{S01}R^{S01}$—. $L^{S05}$ is a straight or branched $C_1$-$C_4$ alkylene group, or may bond with $R^{S02}$ within a common unit to form a $C_3$-$C_{10}$ non-aromatic ring with the carbon atom to which they are attached. $L^{S06}$ is methylene, 1,2-ethylene, 1,3-propylene, or 1,4-butylene. Rf is a linear perfluoroalkyl group of 3 to 6 carbon atoms, typically 3H-perfluoropropyl, 4H-perfluorobutyl, 5H-perfluoropentyl, or 6H-perfluorohexyl. The subscripts (a-1), (a-2), (a-3), b and c are numbers in the range: 0≤(a-1)<1, 0≤(a-2)<1, 0≤(a-3)<1, 0<(a-1)+(a-2)+(a-3)<1, 0≤b<1, 0≤c<1, and 0<(a-1)+(a-2)+(a-3)+b+c≤1.

In the resist composition, the polymeric surfactant is preferably formulated in an amount of 0.001 to 20 parts, and more preferably 0.01 to 10 parts by weight, per 100 parts by weight of the base resin. Reference should also be made to JP-A 2007-297590.

The multilayer film may include a resist protective layer so that it may be applied to the immersion lithography using water. The protective layer prevents any component from being leached out of the resist layer, thereby improving the water slip on the layer surface. The protective layer may preferably be formed of a base resin which is insoluble in water, but soluble in alkaline developer, for example, a polymer having an alcohol structure having a plurality of fluorine atoms substituted at β-position such as a polymer having 1,1,1,3,3,3-hexafluoro-2-propanol residue. Typically a protective layer-forming composition comprising such a base resin in a higher alcohol of at least 4 carbon atoms or an ether compound of 8 to 12 carbon atoms is used. The protective layer may be formed by spin coating the protective layer-forming composition onto a resist layer as prebaked, and prebaking the coating. The protective layer preferably has a thickness of 10 to 200 nm.

EXAMPLE

Examples of the invention are given below by way of illustration and not by way of limitation. The amount "pbw" is parts by weight.

Synthesis Example 1

Synthesis of 3-butyl-2-(2-{3-[2-(3-butyl-1,1-dimethyl-1H-benzo[e]indol-2(3H)-ylidene)ethylidene]-2-(phenylsulfonyl)-cyclopent-1-en-1-yl}ethenyl)-1,1-dimethyl-1H-benzo[e]indol-3-ium perfluorobutanesulfonate, Designated Dye-A

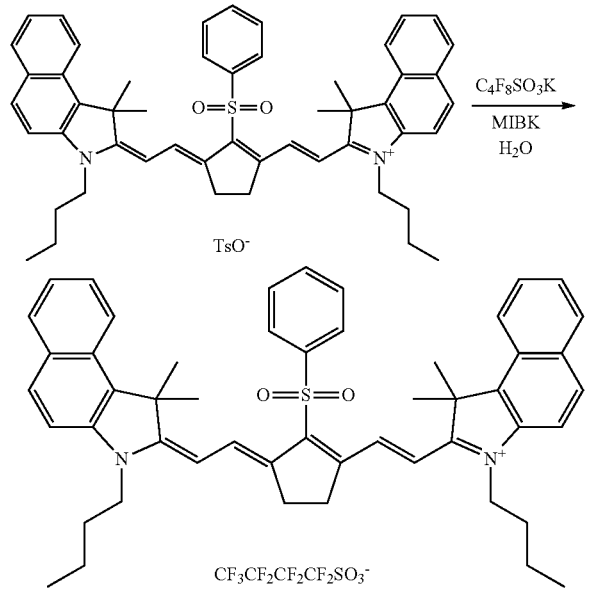

A mixture of 0.96 g (1 mmol) of 3-butyl-2-(2-{3-[2-(3-butyl-1,1-dimethyl-1H-benzo[e]indol-2(3H)-ylidene)-ethylidene]-2-(phenylsulfonyl)cyclopent-1-en-1-yl}ethenyl)-1,1-dimethyl-1H-benzo[e]indol-3-ium p-toluenesulfonate, 0.51 g (1.5 mmol) of potassium perfluorobutanesulfonate, 20 g of water, and 20 g of methyl isobutyl ketone was stirred for 6 hours at room temperature, whereupon the organic layer was taken out. The organic layer was combined with 0.17 g (0.5 mmol) of potassium perfluorobutanesulfonate and 20 g of water and stirred overnight, whereupon the organic layer was taken out. The organic layer was washed with water and concentrated in vacuum. Diisopropyl ether was added to the residue for recrystallization. The crystal was collected and dried in vacuum, obtaining the target compound, 3-butyl-2-(2-{3-[2-(3-butyl-1,1-dimethyl-1H-benzo[e]indol-2(3H)-ylidene)ethylidene]-2-(phenylsulfonyl)cyclopent-1-en-1-yl}ethenyl)-1,1-dimethyl-1H-benzo[e]indol-3-ium perfluorobutanesulfonate. Brown crystal, 1.1 g, yield 92%.

Figure 2:
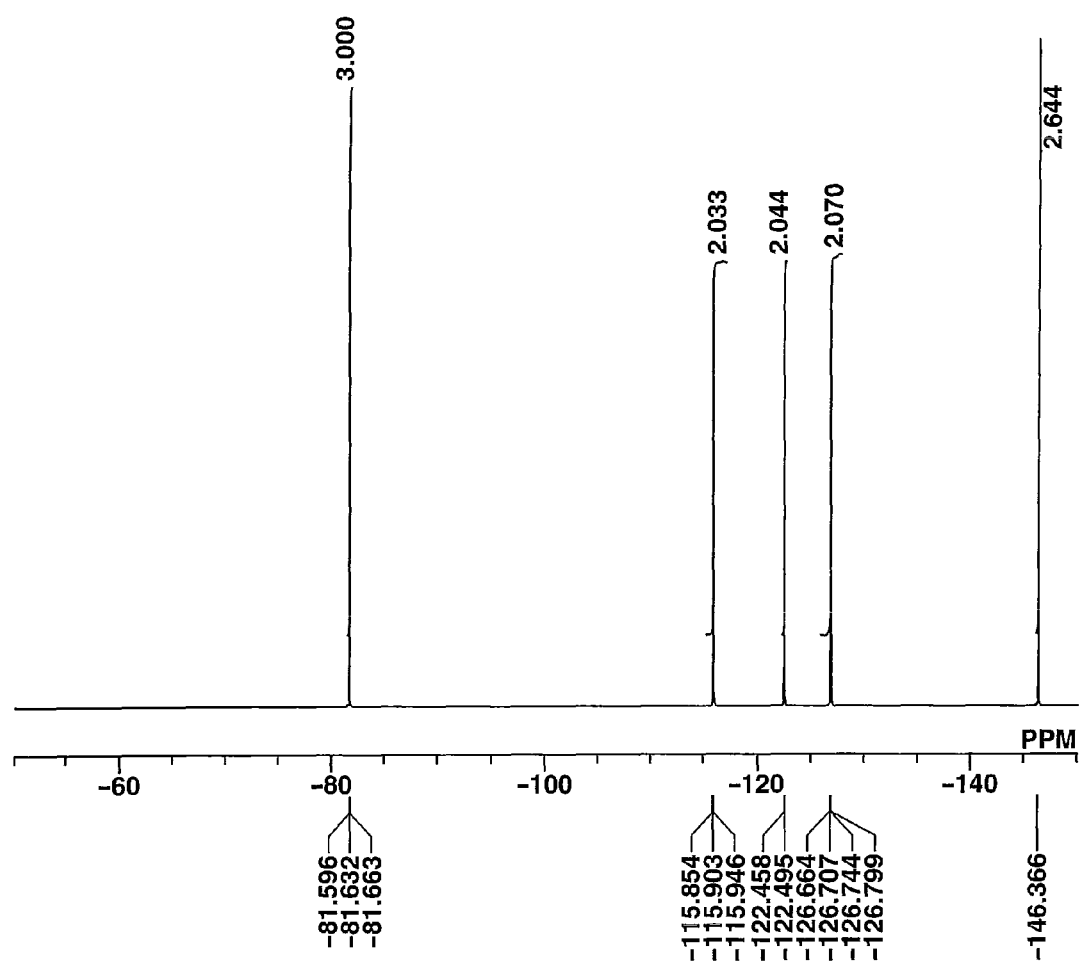

The compound was analyzed by attenuated total reflection infrared absorption and nuclear magnetic resonance spectroscopies. The spectral data are shown below. The NMR spectra ($^1$H-NMR and $^{19}$F-NMR/DMSO-$d_6$) are shown in FIGS. 1 and 2. It is noted that in $^1$H-NMR analysis, traces of residual solvents (diisopropyl ether, methyl isobutyl ketone, water) were observed. From the data of $^1$H-NMR and $^{19}$F-NMR spectroscopies using 1,2,4,5-tetrafluoro-3,6-dimethylbenzene as the internal standard, an anion/cation ratio was computed to be 1.00/0.98.

Infrared Absorption Spectrum IR (D-ATR)
    2958, 2932, 2870, 1712, 1541, 1505, 1440, 1430, 1409, 1392, 1359, 1322, 1272, 1229, 1187, 1170, 1140, 1127, 1109, 1083, 1053, 1047, 1014, 959, 927, 902, 892, 867, 834, 818, 805, 786, 754, 724, 682, 652, 634, 624, 602, 584 cm$^{-1}$ Time-of-Flight Mass Spectroscopy (TOP-MS); MALDI
    Positive M$^+$759 (corresponding to $C_{51}H_{55}N_2O_2S$)
    Negative M$^-$298 (corresponding to $C_4F_9O_3S$)

Synthesis Example 1-2

Synthesis of 3-butyl-2-(2-{3-[2-(3-butyl-1,1-dimethyl-1H-benzo[e]indol-2(3H)-ylidene)ethylidene]-2-(phenyl-sulfonyl)cyclopent-1-en-1-yl}ethenyl)-1,1-dimethyl-1H-benzo[e]indol-3-ium bis(trifluoromethylsulfonyl)imide, Designated Dye-B

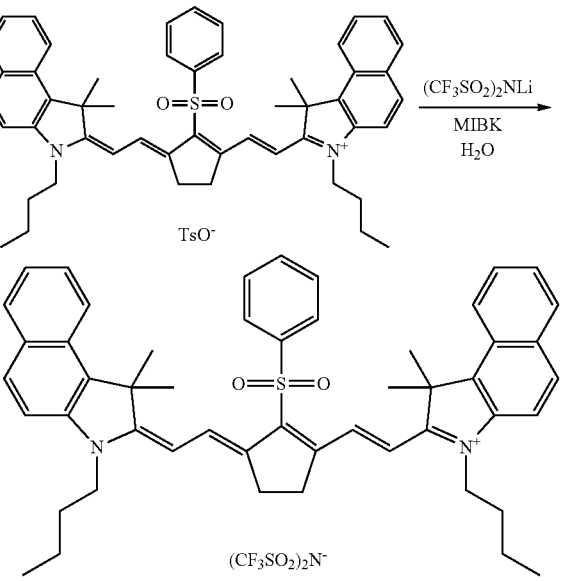

A mixture of 2.87 g (3 mmol) of 3-butyl-2-(2-{3-[2-(3-butyl-1,1-dimethyl-1H-benzo[e]indol-2(3H)-ylidene)-ethylidene]-2-(phenylsulfonyl)cyclopent-1-en-1-yl}ethenyl)-1,1-dimethyl-1H-benzo[e]indol-3-ium p-toluenesulfonate, 1.31 g (4.5 mmol) of lithium bis(trifluoromethanesulfonyl)imide, 40 g of water, and 40 g of methyl isobutyl ketone was stirred for 8 hours at room temperature, whereupon the organic layer was taken out. The organic layer was combined with 0.43 g (1.5 mmol) of lithium bis(trifluoromethanesulfonyl)imide and 40 g of water and stirred overnight, whereupon the organic layer was taken out. The organic layer was washed with water and concentrated in vacuum. Diisopropyl ether was added to the residue for recrystallization. The crystal was collected and dried in vacuum, obtaining the target compound, 3-butyl-2-(2-{3-[2-(3-butyl-1,1-dimethyl-1H-benzo[e]indol-2(3H)-ylidene)ethylidene]-2-(phenylsulfonyl)cyclopent-1-en-1-yl}ethenyl)-1,1-dimethyl-1H-benzo[e]indol-3-ium bis(trifluoromethylsulfonyl)imide. Brown crystal, 2.9 g, yield 87%.

Figure 3:
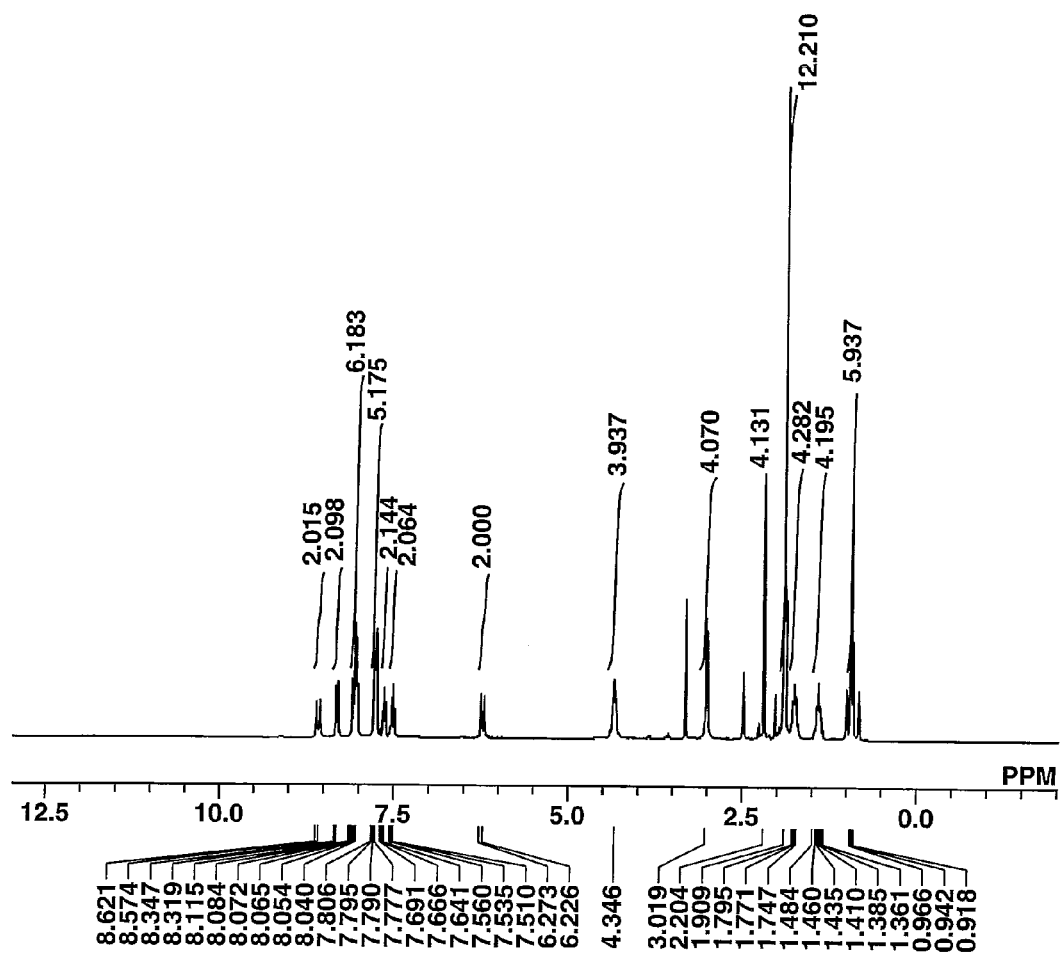
FIGS. 3 and 4 are diagrams of $^1$H-NMR and $^{19}$F-NMR/DMSO-$d_6$ spectra of Dye-B in Synthesis Example 1-2, respectively.
Figure 4:
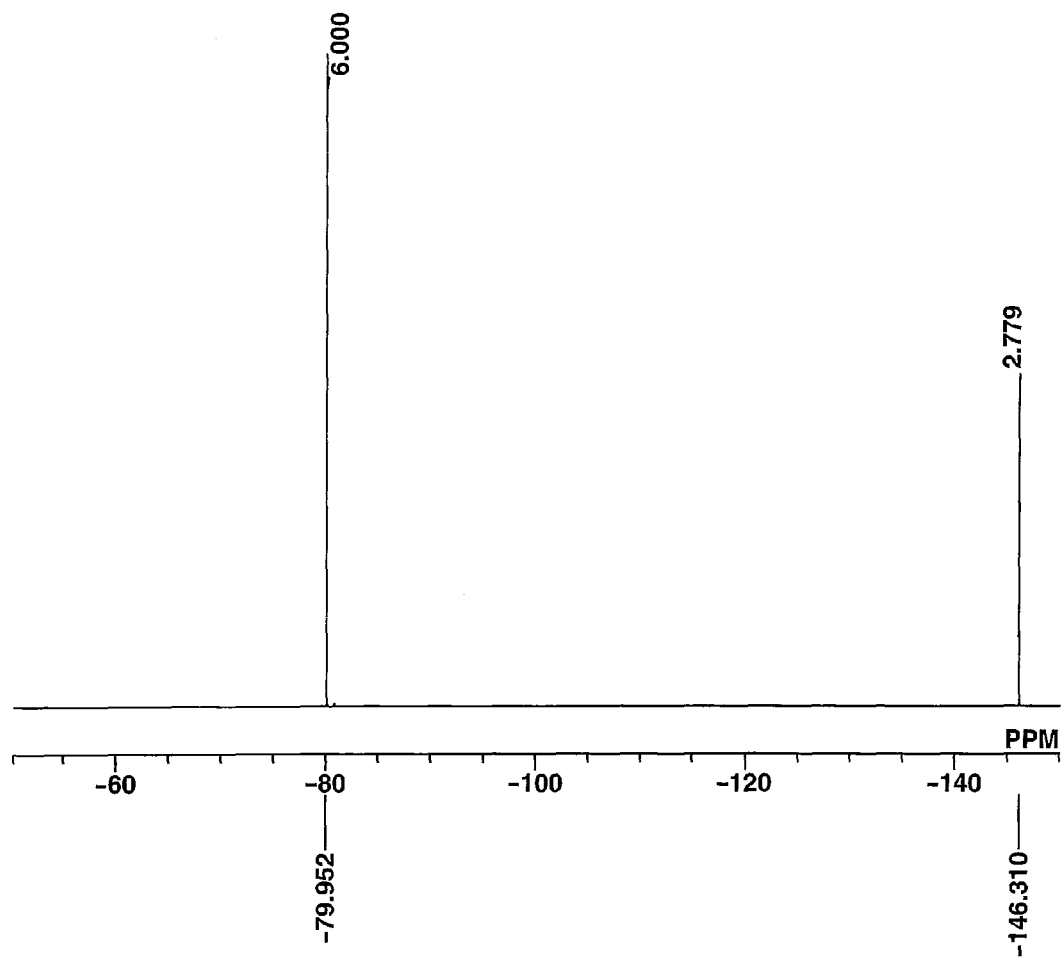

The compound was analyzed by infrared and nuclear magnetic resonance spectroscopies. The spectral data are shown below. The NMR spectra ($^1$H-NMR and $^{19}$F-NMR/DMSO-$d_6$) are shown in FIGS. 3 and 4. It is noted that in $^1$H-NMR analysis, traces of residual solvents (diisopropyl ether, methyl isobutyl ketone, water) were observed. From the data of $^1$H-NMR and $^{19}$F-NMR spectroscopies using 1,2,4,5-tetrafluoro-3,6-dimethylbenzene as the internal standard, an anion/cation ratio was computed to be 1.00/0.99.

Infrared Absorption Spectrum IR (KBr)

3432, 2961, 2933, 2873, 1624, 1599, 1584, 1536, 1503, 1460, 1441, 1432, 1416, 1387, 1352, 1280, 1228, 1182, 1166, 1137, 1102, 1061, 1013, 958, 922, 897, 864, 832, 808, 786, 748, 725, 680, 651, 616, 588, 569, 553, 534, 525, 511 cm$^{-1}$

Time-of-Flight Mass Spectroscopy (TOF-MS); MALDI

Positive M$^+$759 (corresponding to $C_{51}H_{55}N_2O_2S$)

Negative M$^-$279 (corresponding to $C_2F_6O_4NS_2$)

Synthesis Example 1-3

Synthesis of 3-butyl-2-(2-{3-[2-(3-butyl-1,1-dimethyl-1H-benzo[e]indol-2(3H)-ylidene)ethylidene]-2-(phenyl-sulfonyl)cyclopent-1-en-1-yl}ethenyl)-1,1-dimethyl-1H-benzo[e]indol-3-ium tris(trifluoromethylsulfonyl)methide, Designated Dye-C

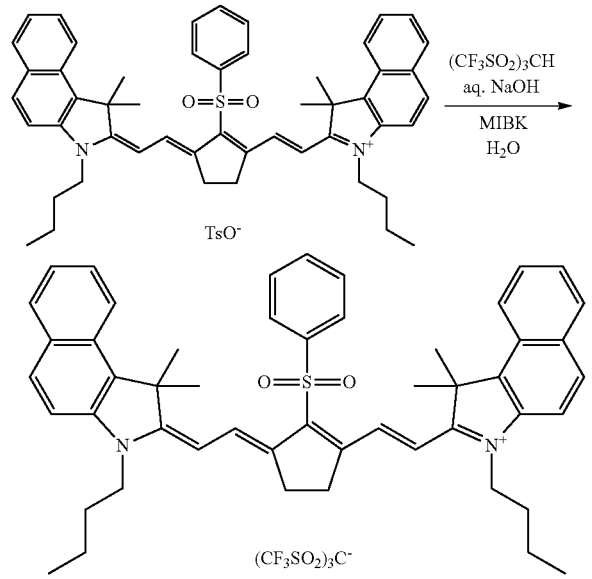

A mixture of 1.86 g (2 mmol) of 3-butyl-2-(2-{3-[2-(3-butyl-1,1-dimethyl-1H-benzo[e]indol-2(3H)-ylidene)-ethylidene]-2-(phenylsulfonyl)cyclopent-1-en-1-yl}ethenyl)-1,1-dimethyl-1H-benzo[e]indol-3-ium p-toluenesulfonate, 2.21 g (3 mmol) of a 56% tris(trifluoromethanesulfonyl)methide acid aqueous solution, 0.48 g of a 25% sodium hydroxide aqueous solution, 30 g of water, and 30 g of methyl isobutyl ketone was stirred for 8 hours at room temperature, whereupon the organic layer was taken out. The organic layer was combined with 0.74 g (1 mmol) of a 56% tris(trifluoromethanesulfonyl)methide acid aqueous solution and 30 g of water and stirred overnight, whereupon the organic layer was taken out. The organic layer was washed with water and concentrated in vacuum. Diisopropyl ether was added to the residue for recrystallization. The crystal was collected and dried in vacuum, obtaining the target compound, 3-butyl-2-(2-{3-[2-(3-butyl-1,1-dimethyl-1H-benzo[e]indol-2(3H)-ylidene)ethylidene]-2-(phenylsulfonyl)cyclopent-1-en-1-yl}ethenyl)-1,1-dimethyl-1H-benzo[e]indol-3-ium tris(trifluoromethylsulfonyl)methide. Brown crystal, 2.2 g, yield 92%.

Figure 5:
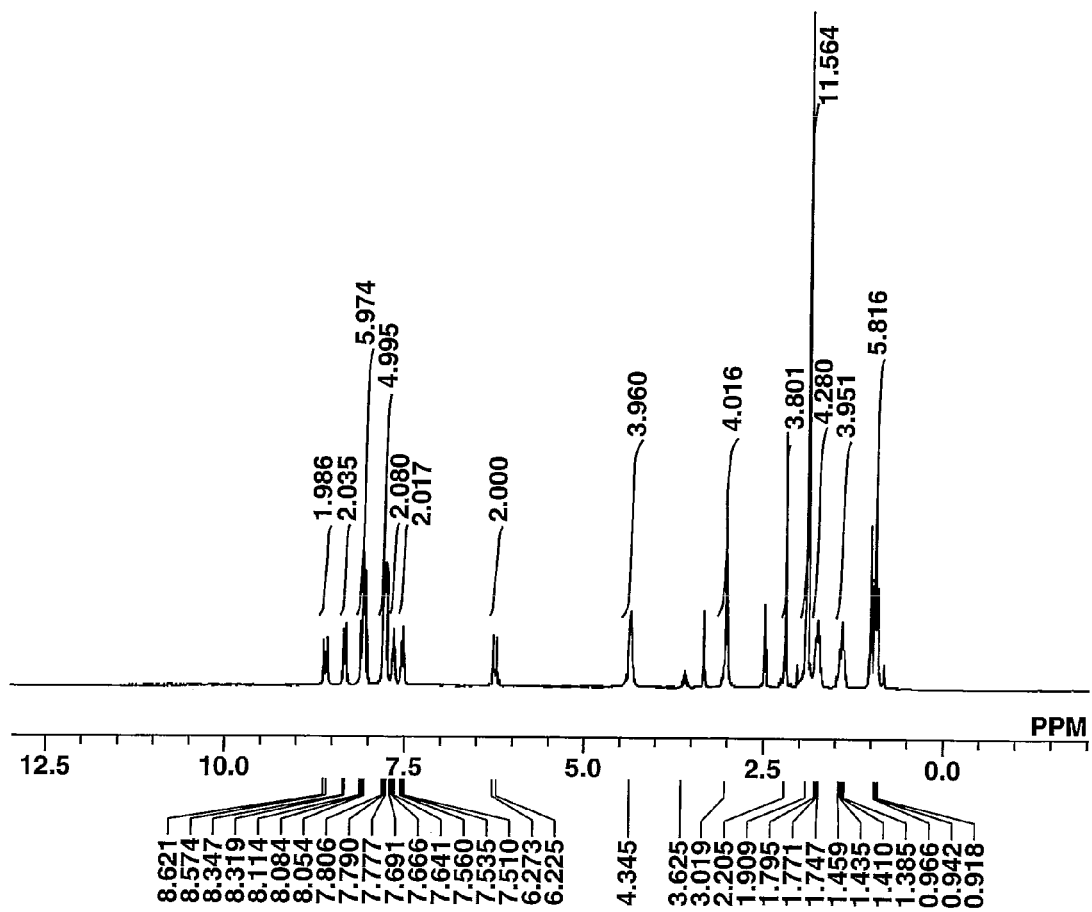
FIGS. 5 and 6 are diagrams of $^1$H-NMR and $^{19}$F-NMR/DMSO-$d_6$ spectra of Dye-C in Synthesis Example 1-3, respectively.
Figure 6:
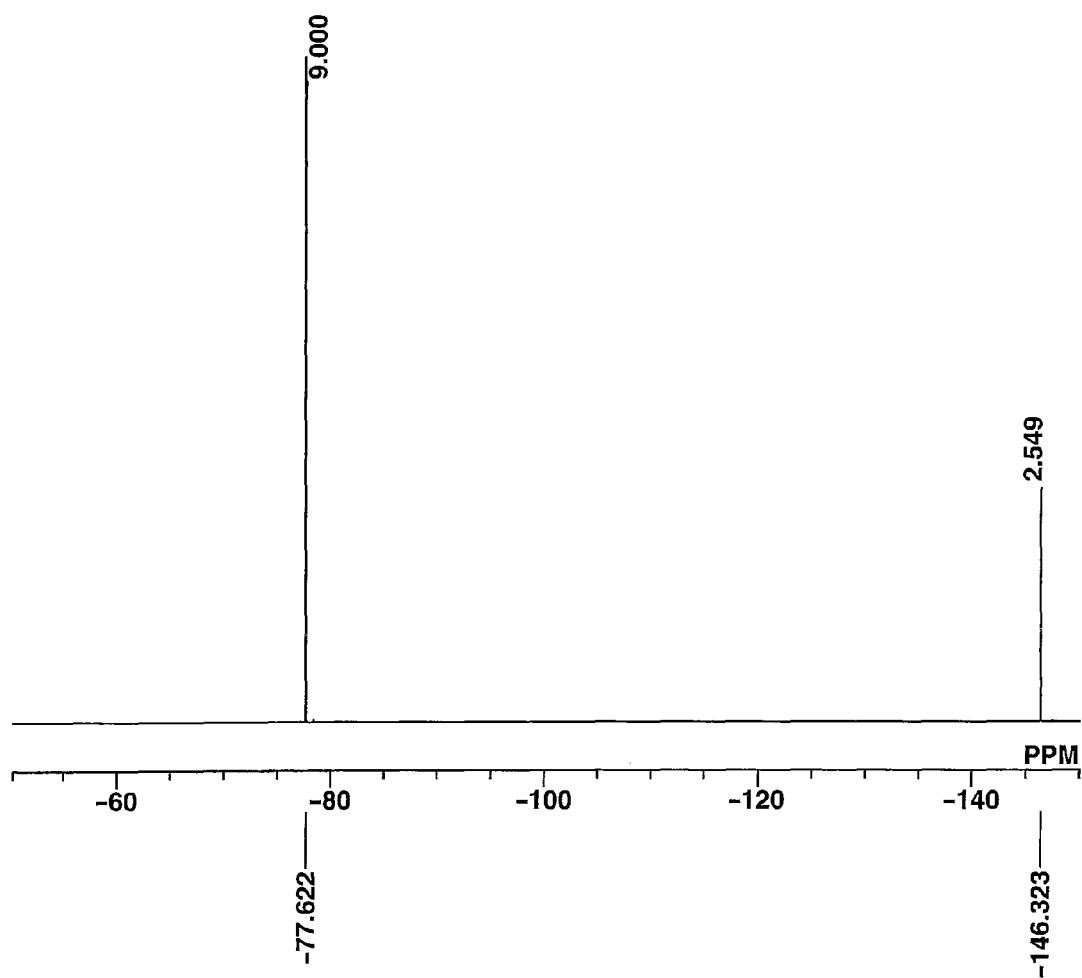

The compound was analyzed by infrared and nuclear magnetic resonance spectroscopies. The spectral data are shown below. The NMR spectra ($^1$H-NMR and $^{19}$F-NMR/DMSO-$d_6$) are shown in FIGS. 5 and 6. It is noted that in $^1$H-NMR analysis, traces of residual solvents (diisopropyl ether, methyl isobutyl ketone, water) were observed. From the data of $^1$H-NMR and $^{19}$F-NMR spectroscopies using 1,2,4,5-tetrafluoro-3,6-dimethylbenzene as the internal standard, an anion/cation ratio was computed to be 1.00/0.99.

Infrared Absorption Spectrum IR (D-ATR)

2962, 2934, 1538, 1504, 1463, 1442, 1433, 1418, 1377, 1356, 1325, 1275, 1234, 1181, 1140, 1123, 1084, 1013, 974, 926, 897, 868, 833, 805, 786, 751, 724, 682, 622, 584 cm$^{-1}$

Time-of-Flight Mass Spectroscopy (TOF-MS); MALDI

Positive M$^+$759 (corresponding to $C_{51}H_{55}N^2O_2S$)

Negative M$^-$410 (corresponding to $C_4F_9O_6S_3$)

Additionally, NIR absorbing dye (Dye-D) used in Example and NIR absorbing dyes (Dye-E, F and G) used in Comparative Examples have the structure shown below.

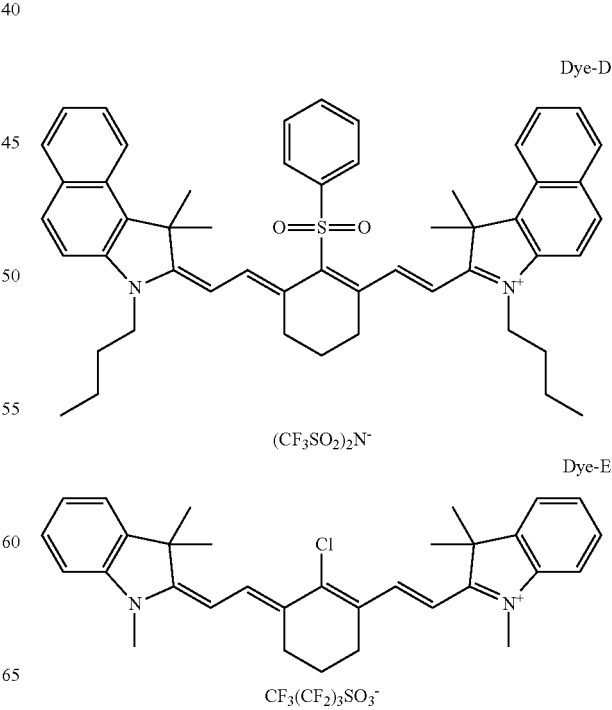

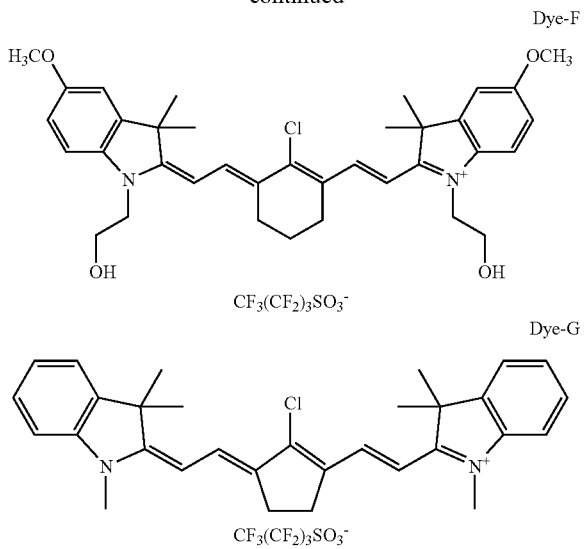

Dye-F

CF₃(CF₂)₃SO₃⁻

Dye-G

CF₃(CF₂)₃SO₃⁻

Synthesis Example 2-1

Synthesis of Polymer 1

In a nitrogen atmosphere, a flask was charged with 13.07 g of 3,4-epoxycyclohexylmethyl methacrylate, 6.93 g of styrene, 0.920 g of dimethyl 2,2'-azobisisobutyrate (MAIB), and 20.00 g of propylene glycol monomethyl ether acetate (PGMEA) to form a monomer solution 1. Another flask in a nitrogen atmosphere was charged with 10.00 g of PGMEA, and heated at 80° C. while stirring. Thereafter, monomer solution 1 was added dropwise to the other flask over 2 hours. The solution was continuously stirred for 6 hours to effect polymerization while maintaining the temperature of 80° C. With the heat interrupted, the flask was allowed to cool down to room temperature. The polymerization solution was diluted with 16.67 g of PGMEA and added dropwise to a mixture of 32 g of water and 288 g of methanol being stirred, for precipitation. The polymer precipitate was collected by filtration, washed twice with 120 g of methanol, and vacuum dried at 50° C. for 20 hours, yielding 18.07 g of a polymer in white powder solid form, designated Polymer 1. The yield was 90%. Polymer 1 had a Mw of 14,300 and a dispersity Mw/Mn of 2.73 as determined by GPC versus polystyrene standards. Upon ¹H-NMR analysis, Polymer 1 had a copolymer compositional ratio of 52/48 mol %, expressed as (units derived from 3,4-epoxycyclohexylmethyl methacrylate)/(units derived from styrene).

Synthesis Example 2-2

Synthesis of Polymer 2

In a nitrogen atmosphere, a flask was charged with 11.20 g of 3,4-epoxycyclohexylmethyl methacrylate, 8.80 g of 2-vinylnaphthalene, 0.788 g of MAIB, and 20.00 g of PGMEA to form a monomer solution 2. Another flask in a nitrogen atmosphere was charged with 10.00 g of PGMEA, and heated at 80° C. while stirring. Thereafter, monomer solution 2 was added dropwise to the other flask over 2 hours. The solution was continuously stirred for 2 hours to effect polymerization while maintaining the temperature of 80° C. With the heat interrupted, the flask was allowed to cool down to room temperature. The polymerization solution was diluted with 16.67 g of PGMEA and added dropwise to a mixture of 32 g of water and 288 g of methanol being stirred, for precipitation. The polymer precipitate was collected by filtration, washed twice with 120 g of methanol, and vacuum dried at 50° C. for 20 hours, yielding 17.85 g of a polymer in white powder solid form, designated Polymer 2. The yield was 89%. Polymer 2 had a Mw of 13,700 and a dispersity Mw/Mn of 1.78 as determined by GPC versus polystyrene standards. Upon ¹H-NMR analysis, Polymer 2 had a copolymer compositional ratio of 51/49 mol %, expressed as (units derived from 3,4-epoxycyclohexylmethyl methacrylate)/(units derived from 2-vinylnaphthalene).

Measurement of Physical Properties of NIR Absorbing Dye

Each of NIR absorbing dyes Dye-A to G was dissolved in cyclohexanone to form a 3 wt % solution. Each solution was filtered through a Teflon® filter with a pore size of 0.2 μm. The resulting coating solution was coated onto a silicon substrate and baked at 195° C. for 60 seconds to form a coating film for measurement. Using a variable angle spectroscopic ellipsometer (VASE®, by J. A. Woollam, Inc.), a maximum absorption wavelength (λmax) of the film and an extinction coefficient (k) at that wavelength were measured. The results are shown in Table 1.

TABLE 1

| NIR absorbing dye | λmax (nm) | k at λmax |
|---|---|---|
| Dye-A | 950 | 1.38 |
| Dye-B | 960 | 1.46 |
| Dye-C | 950 | 1.40 |
| Dye-D | 920 | 1.52 |
| Dye-E | 820 | 1.44 |
| Dye-F | 850 | 1.44 |
| Dye-G | 840 | 1.41 |

Examples 1 to 3 and Comparative Examples 1 to 3

Coating solutions were prepared by mixing a NIR absorbing dye (Dye-A to G), polymer (Polymer 1, 2), acid generator (AG1), and surfactant FC-4430 (3M Sumitomo Co., Ltd.) in a solvent. Each of the coating solutions was coated onto a silicon substrate and baked at 195° C. for 60 seconds to form a film, the ease of film formation being evaluated. The composition of the coating solutions is reported in Table 2 together with the ease of film formation. The symbol "◯" indicates good film formation and "x" indicates defective film formation.

TABLE 2

| | | Designation | Polymer (pbw) | NIR absorbing dye (pbw) | Acid generator (pbw) | Surfactant (pbw) | Organic solvent (pbw) | Film formation |
|---|---|---|---|---|---|---|---|---|
| Example | 1 | M-01 | Polymer 1 (67) | Dye-A (33) | AG1 (5) | FC-4430 (0.1) | cyclohexanone (1,340) PGMEA (150) | ◯ |

TABLE 2-continued

|  | Designation | Polymer (pbw) | NIR absorbing dye (pbw) | Acid generator (pbw) | Surfactant (pbw) | Organic solvent (pbw) | Film formation |
|---|---|---|---|---|---|---|---|
|  | 2 M-02 | Polymer 1 (67) | Dye-B (33) | AG1 (5) | FC-4430 (0.1) | cyclohexanone (1,340) PGMEA (150) | ○ |
|  | 3 M-03 | Polymer 1 (67) | Dye-C (33) | AG1 (5) | FC-4430 (0.1) | cyclohexanone (1,340) PGMEA (150) | ○ |
| Comparative Example | 1 M-04 | Polymer 1 (67) | Dye-E (33) | AG1 (5) | FC-4430 (0.1) | cyclohexanone (1,340) PGMEA (150) | ○ |
|  | 2 M-05 | Polymer 1 (67) | Dye-F (33) | AG1 (5) | FC-4430 (0.1) | cyclohexanone (1,340) PGMEA (150) | ○ |
|  | 3 M-06 | Polymer 1 (67) | Dye-G (33) | AG1 (5) | FC-4430 (0.1) | cyclohexanone (1,340) PGMEA (150) | X |

Note that the components in Table 2 are as identified below.
Acid generator AG1: triethylammonium nonaflate
Organic solvent PGMEA: propylene glycol monomethyl ether acetate As seen from Table 2, the composition of Comparative Example 3 showed defective film formation.

Examples 4 and 5 and Comparative Example 4

Optical Constants of NIR Absorptive Film

NIR absorptive film-forming materials of the same compositions as Examples 1 and 2 (M-01, M-02) and Comparative Example 2 (M-05) were prepared and filtered through a Teflon® filter with a pore size of 0.2 μm. Each of the resulting coating solutions (Examples 4 and 5 and Comparative Example 4) was coated onto a silicon substrate and baked at 195° C. for 60 seconds to form a film for optical constant measurement. Using a variable angle spectroscopic ellipsometer (VASE®, by J. A. Woollam, Inc.), an extinction coefficient (k) of the film was measured over a wavelength range of 400 to 1,100 nm. From the k values measured, a cutoff rate in that NIR region was computed, with the results shown in Table 3.

TABLE 3

|  | Designation | Cutoff rate (%) |
|---|---|---|
| Example 4 | M-01 | 46 |
| Example 5 | M-02 | 47 |
| Comparative Example 4 | M-05 | 40 |

As seen from Table 3, the NIR absorptive films formed of the compositions within the scope of the invention have a higher cutoff rate in the wavelength range of 400 to 1,100 nm than the film of Comparative Example 4.

Examples 6 and 7 and Comparative Example 5

Solvent Resistance Test

NIR absorptive layer-forming materials of the same compositions as Examples 1 and 2 (M-01, M-02) and Comparative Example 1 (M-04) were prepared and filtered through a Teflon® filter with a pore size of 0.2 μm. Each of the resulting coating solutions (Examples 6 and 7 and Comparative Example 5) was coated onto a silicon substrate and baked at 195° C. for 60 seconds to form a film. A mixture of PGMEA and propylene glycol monomethyl ether (PGME) in a weight ratio of 30:70 was spin coated onto the film, followed by baking at 100° C. for 30 seconds. A difference in film thickness before and after solvent treatment was determined, with the results shown in Table 4.

TABLE 4

|  | Designation | Difference in film thickness before and after solvent treatment (nm) |
|---|---|---|
| Example 6 | M-01 | 2.9 |
| Example 7 | M-02 | 1.6 |
| Comparative Example 5 | M-04 | 10.8 |

As seen from Table 4, the NIR absorptive films formed of the compositions within the scope of the invention experience a less film thickness loss by solvent treatment than the film of Comparative Example 5.

Examples 8 to 10 and Comparative Example 6

Each of inventive NIR absorbing dyes (Dye-A, B, D) and comparative NIR absorbing dye (Dye-E) was dissolved in cyclohexanone to form a 3 wt % solution. Each solution was filtered through a Teflon® filter with a pore size of 0.2 μm. The resulting coating solution was coated onto a silicon substrate and baked at a temperature of 180° C., 200° C. or 220° C. for 60 seconds to form a coating film. Using a variable angle spectroscopic ellipsometer (VASE®, by J. A. Woollam, Inc.), an extinction coefficient (k) of the film was measured. The temperature at which the k value starts decreasing is an incipient degradation temperature of dye, that is, heat resistance temperature. The results are shown in Table 5.

TABLE 5

| | Dye | Heat resistance temperature (° C.) |
|---|---|---|
| Example 8 | Dye-A | ≤200 |
| Example 9 | Dye-B | ≤200 |
| Example 10 | Dye-D | ≤220 |
| Comparative Example 6 | Dye-E | failed in film formation on 200° C. bake |

As seen from Table 5, the inventive NIR absorbing dyes (Dye-A, B and D) are in stark contrast to the dye used in Comparative Example 6 which causes defective film formation on high-temperature bake.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2010-098464 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A near-infrared absorptive layer-forming composition consisting of:

(A) at least one near-infrared absorbing dye having the formula (1):

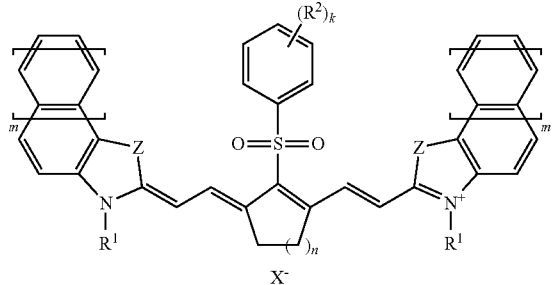

(1)

wherein $R^1$ and $R^2$ are each independently a monovalent $C_1$-$C_{20}$ hydrocarbon group which may contain a heteroatom, k is an integer of 0 to 5, m is 1, n is 1 or 2, Z is oxygen, sulfur or C(R')(R''), R' and R'' are each independently hydrogen or a monovalent $C_1$-$C_{20}$ hydrocarbon group which may contain a heteroatom, and $X^-$ is an anion of the formula (1-3):

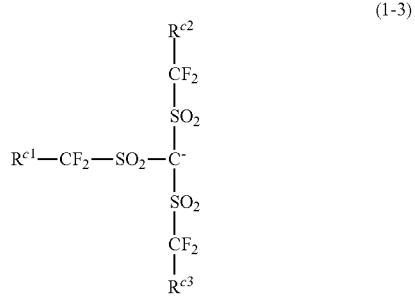

(1-3)

wherein $R^{c1}$, $R^{c2}$ and $R^{c3}$ are each independently fluorine or a monovalent $C_1$-$C_{20}$ hydrocarbon group which may contain a heteroatom, $R^{c1}$ and $R^{c2}$ may bond together to form a ring with the linkage to which they are attached, the ring-forming $R^{c1}$—$R^{c2}$ being a single bond or a divalent hydrocarbon group of 1 to 20 carbon atoms in total which may contain a heteroatom;

(B) at least one polymer comprising repeat units capable of undergoing crosslinking reaction in the presence of an acid, said repeat units having an oxirane structure and/or oxetane structure;

(C) at least one solvent;

(D) an acid generator;

(E) a crosslinker; and (F) a surfactant, wherein, per 100 parts by weight of the overall polymer, the near-infrared absorbing dye is used in an amount of 49 to 100 parts by weight, the organic solvent is added in an amount of 900 to 20,000 parts by weight, the acid generator is added in an amount of 0.1 to 50 parts by weight, the crosslinker is added in an amount of 0 to 50 parts by weight, and the surfactant is added in an amount of up to 2 parts by weight.

2. The composition of claim 1 wherein the near-infrared absorbing dye (A) has the formula (2):

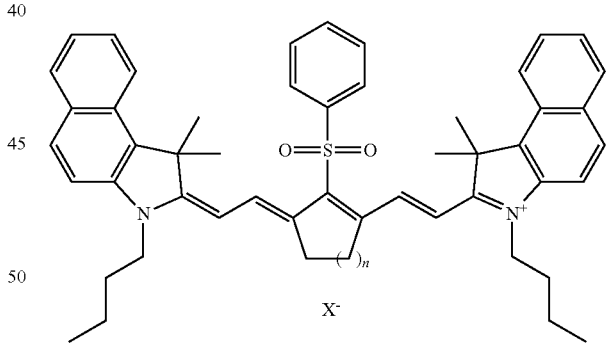

(2)

wherein n is 1 or 2, and $X^-$ is an anion of the formula (1-3):

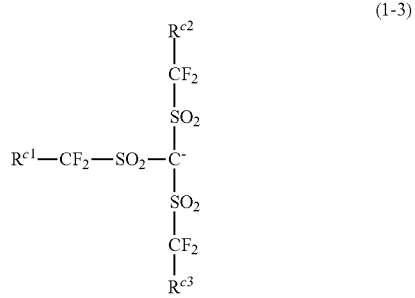

(1-3)

wherein $R^{c1}$, $R^{c2}$ and $R^{c3}$ are each independently fluorine or a monovalent $C_1$-$C_{20}$ hydrocarbon group which may contain a heteroatom, $R^{c1}$ and $R^{c2}$ may bond together to form a ring with the linkage to which they are attached, the ring-forming $R^{c1}$—$R^{c2}$ being a single bond or a divalent hydrocarbon group of 1 to 20 carbon atoms in total which may contain a heteroatom.

3. The composition of claim 2 wherein the near-infrared absorbing dye (A) has the formula (3):

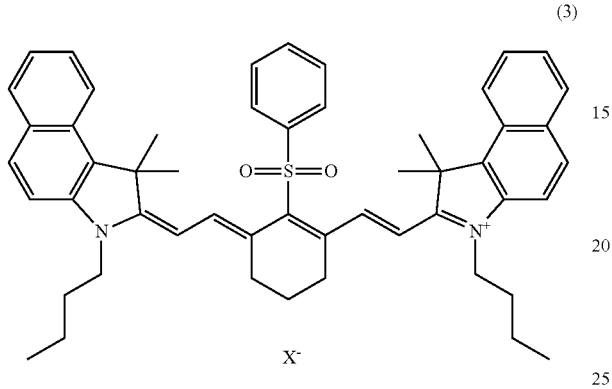

(3)

wherein $X^-$ is an anion of the formula (1-3):

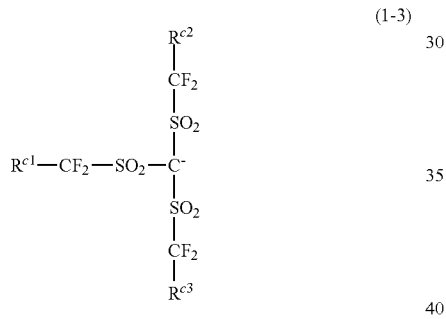

(1-3)

wherein $R^{c1}$, $R^{c2}$ and $R^{c3}$ are each independently fluorine or a monovalent $C_1$-$C_{20}$ hydrocarbon group which may contain a heteroatom, $R^{c1}$ and $R^{c2}$ may bond together to form a ring with the linkage to which they are attached, the ring-forming $R^{c1}$—$R^{c2}$ being a single bond or a divalent hydrocarbon group of 1 to 20 carbon atoms in total which may contain a heteroatom.

4. The composition of claim 1,
wherein the oxirane or oxetane structure-bearing units in polymer (B) are at least one unit selected from the group consisting of the following units:

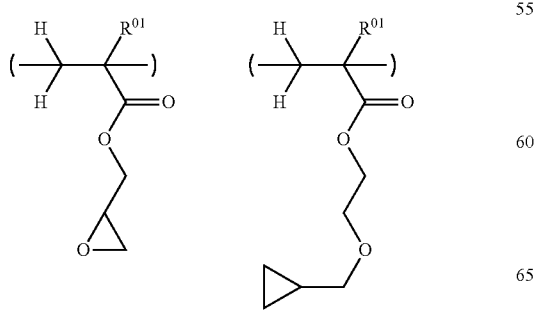

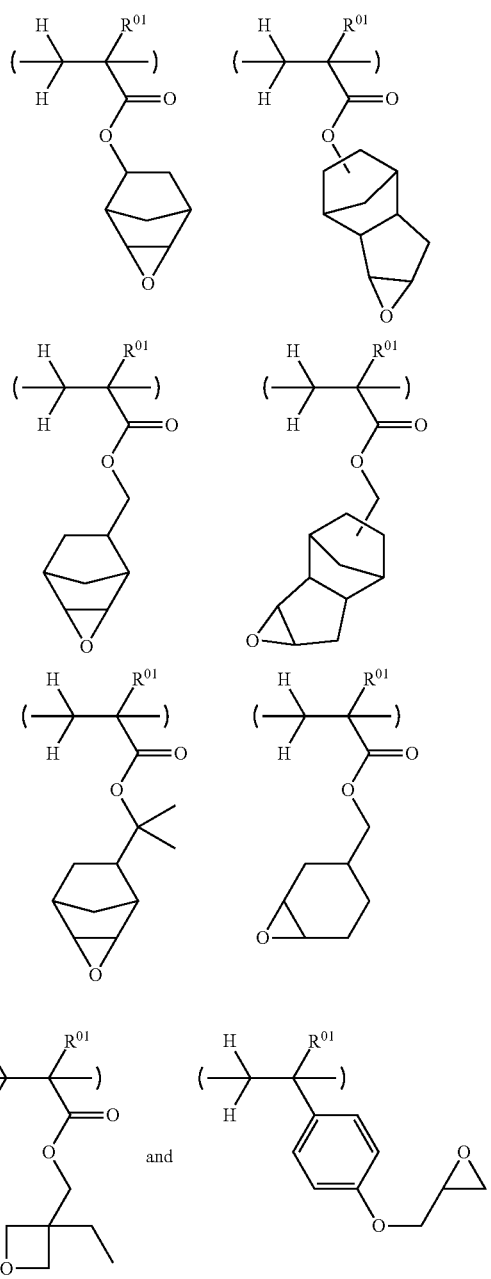

wherein $R^{c1}$ is hydrogen, methyl, fluorine, hydroxymethyl, or trifluoromethyl, and wherein aromatic ring-bearing repeat units are incorporated into polymer (B), said aromatic ring-bearing repeat units being at least one unit selected from the group consisting of the following units:

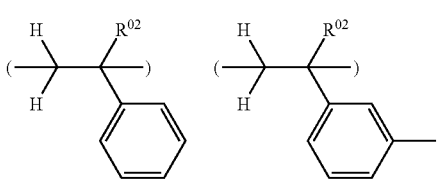

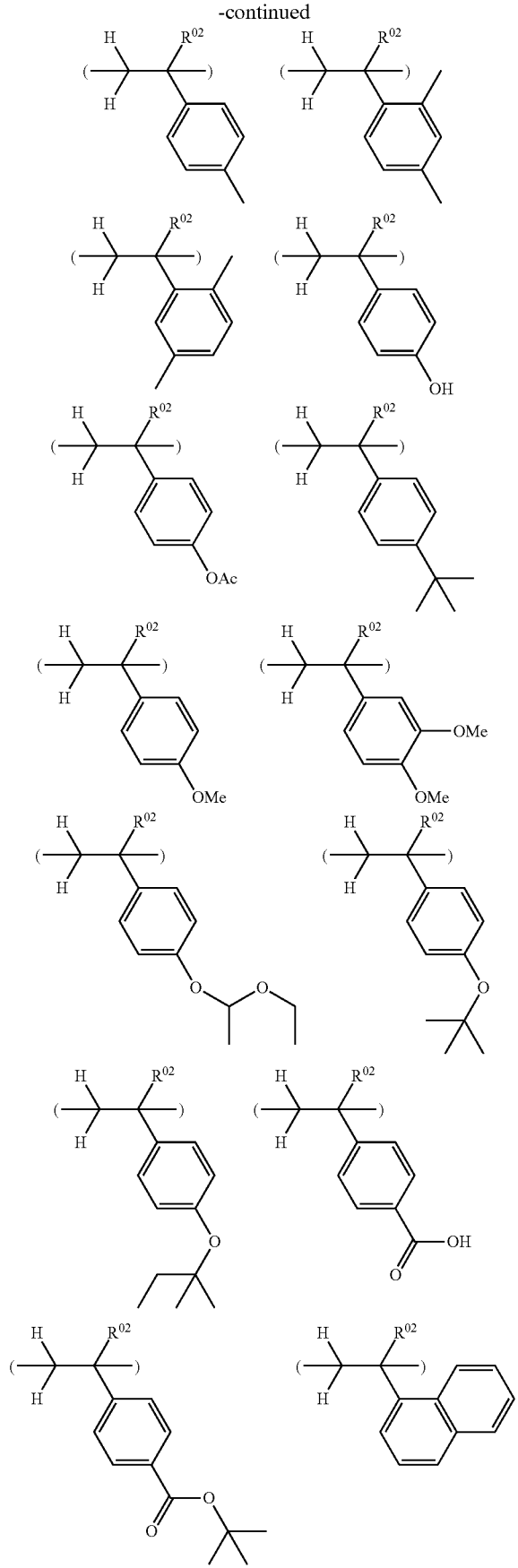
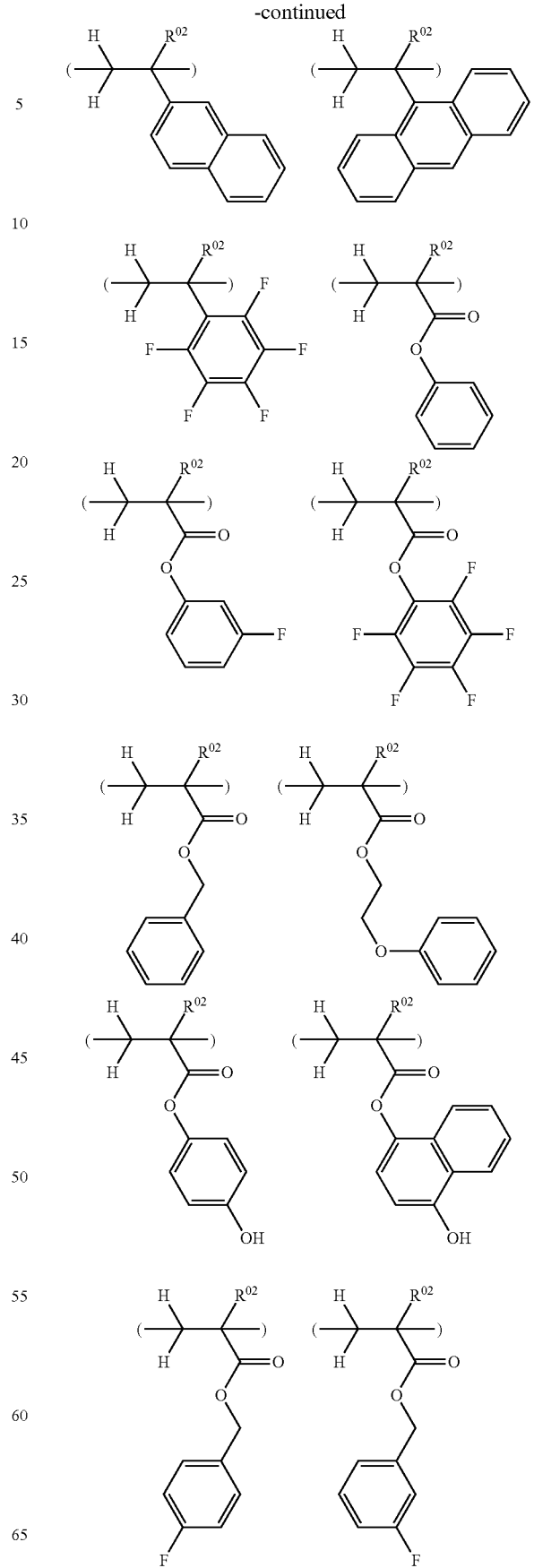

-continued

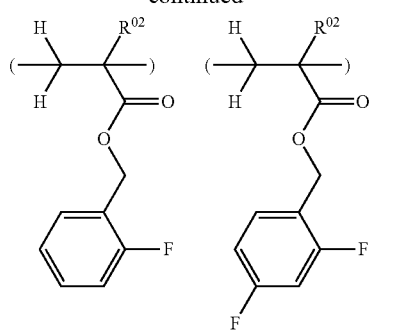
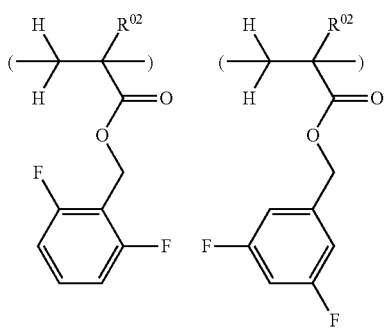
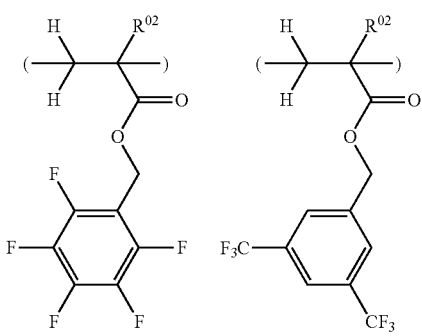
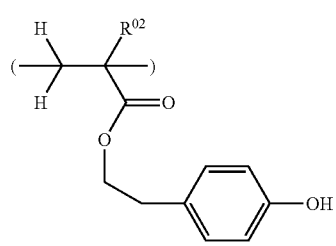
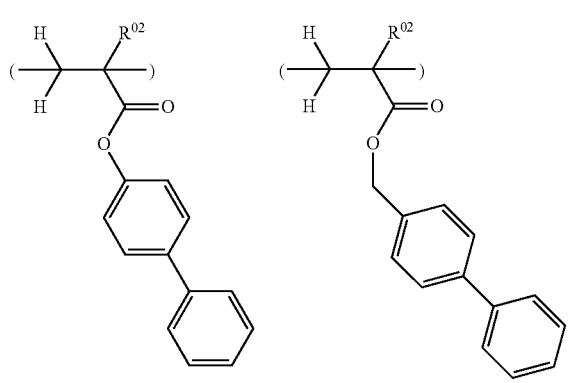

-continued

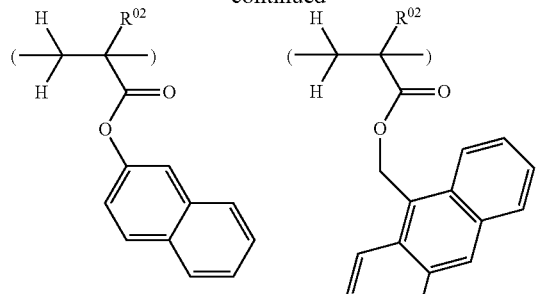
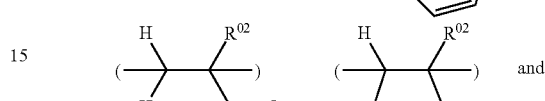

wherein $R^{c2}$ is hydrogen, methyl, fluorine or trifluoromethyl, Me stands for methyl, and Ac stands for acetyl.

5. The near-infrared absorptive layer-forming composition of claim 1, wherein the anion moiety in formula (1) is selected from the group consisting of $(CF_3SO_2)3C^-$, $(CF_3CF_2SO_2)3C^-$, $(CF_3CF_2CF_2SO_2)3C^-$, $(CF_3CF_2CF_2CF_2SO_2)3C^-$,

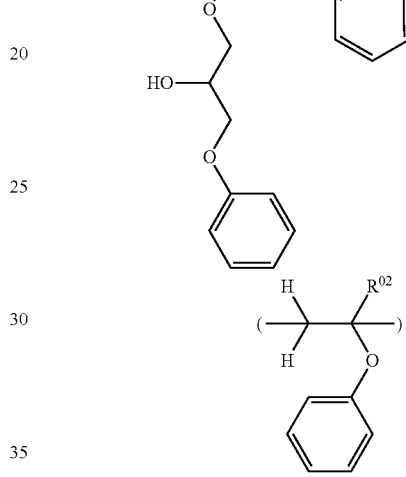

6. The near-infrared absorptive layer-forming composition of claim 1, wherein the polymer (B) has a weight average molecular weight of 100 to 200,000.

7. The near-infrared absorptive layer-forming composition of claim 1, wherein the solvent (C) is selected from the group consisting of cyclohexanone, methyl-2-amylketone, 3-methoxybutanol, 3-methyl-3-methoxybutanol, 1-methoxy-2-propanol, 1-ethoxy-2-propanol, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, γ-butyrolactone, and mixtures thereof.

8. The composition of claim 1, comprising an acid generator selected from the group consisting of one or more sulfonium salts, iodonium salts, ammonium salts, and diazomethanes.

9. The composition of claim 1, comprising a crosslinker selected from the group consisting of one or more of tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof.

10. The composition of claim 1, comprising a surfactant selected from the group consisting of one or more nonionic surfactants, fluorochemical surfactants, organosiloxane polymer surfactants, and partially fluorinated oxetane ring-opened polymers of the formula

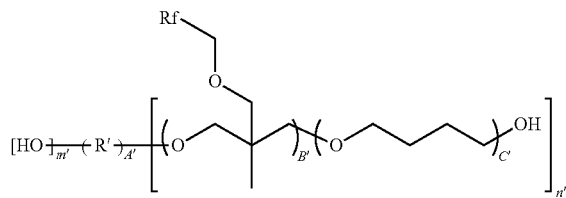

wherein
R' is a di- to tetra-valent $C_2$-$C_5$ aliphatic group,
Rf is trifluoromethyl or pentafluoroethyl,
m' is an integer of 0 to 3, n' is an integer of 1 to 4, and the sum of m' and n', which represents the valence of R', is an integer of 2 to 4,
A' is equal to 1,
B' is an integer of 2 to 25, and
C' is an integer of 0 to 10.

11. A multilayer film comprising
a near-infrared absorptive layer which is formed by coating the near-infrared absorptive layer-forming composition of claim 1, and
a photoresist layer which is formed of a photoresist composition.

12. The multilayer film of claim 11, wherein the near-infrared absorptive layer is disposed beneath the photoresist layer.

13. The multilayer film of claim 12, wherein the near-infrared absorptive layer has a thickness of 3 to 500 nanometers.

14. The multilayer film of claim 11, further comprising a silicon-containing layer disposed beneath the photoresist layer, the near-infrared absorptive layer being disposed beneath the silicon-containing layer.

15. The multilayer film of claim 11 wherein the near-infrared absorptive layer functions as an antireflective coating for preventing reflection of exposure radiation used in resist pattern formation.

* * * * *